(12) United States Patent
Kiyosawa et al.

(10) Patent No.: US 9,130,036 B2
(45) Date of Patent: Sep. 8, 2015

(54) SEMICONDUCTOR DEVICE AND METHOD FOR MANUFACTURING SAME

(71) Applicant: Panasonic Intellectual Property Management Co., Ltd., Osaka (JP)

(72) Inventors: Tsutomu Kiyosawa, Toyama (JP); Kazuhiro Kagawa, Toyama (JP); Yasuyuki Yanase, Gifu (JP); Haruyuki Sorada, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/408,954

(22) PCT Filed: Dec. 6, 2013

(86) PCT No.: PCT/JP2013/007196
§ 371 (c)(1),
(2) Date: Dec. 17, 2014

(87) PCT Pub. No.: WO2014/178094
PCT Pub. Date: Nov. 6, 2014

(65) Prior Publication Data
US 2015/0137221 A1 May 21, 2015

(30) Foreign Application Priority Data
Apr. 30, 2013 (JP) ................................. 2013-095663

(51) Int. Cl.
*H01L 21/34* (2006.01)
*H01L 29/78* (2006.01)
(Continued)

(52) U.S. Cl.
CPC ........ *H01L 29/7813* (2013.01); *H01L 21/0475* (2013.01); *H01L 21/28026* (2013.01);
(Continued)

(58) Field of Classification Search
CPC ..... H01L 21/76; H01L 21/337; H01L 21/475; H01L 21/485; H01L 29/04; H01L 29/16; H01L 29/0649; H01L 29/0623; H01L 29/1095; H01L 29/4236; H01L 29/6606; H01L 29/66068; H01L 29/7813; H01L 29/7828; H01L 29/41766
USPC ........... 257/77, E21.054, 65, 328, 29.084, 81, 257/104; 438/285, 400, 795
See application file for complete search history.

(56) References Cited

U.S. PATENT DOCUMENTS 6,214,107 B1 * 4/2001 Kitabatake ...................... 117/95
2005/0077591 A1 * 4/2005 Fukuda et al. ................. 257/500
(Continued)

FOREIGN PATENT DOCUMENTS

JP  2010-182857 A  8/2010
JP  2011-100967 A  5/2011
(Continued)

OTHER PUBLICATIONS

International Search Report issued in Internation Application No. PCT/JP2013/007196 with Date of mailing Jan. 21, 2014, with English Translation.

*Primary Examiner* — Michael Lebentritt
(74) *Attorney, Agent, or Firm* — McDermott Will & Emery LLP

(57) ABSTRACT

A semiconductor device includes: a substrate with an off-angle; an SiC layer provided on a principal surface of the substrate, including an n type drift region, and having a trench whose bottom is located in the drift region; and a gate electrode provided in the trench in the SiC layer. In the trench in the SiC layer, a first angle formed by at least part of a first sidewall on an off-direction side and the principal surface of the substrate is an obtuse angle, and a second angle formed by at least part of a second sidewall opposite to the first sidewall and the principal surface of the substrate is an acute angle, in a cross section parallel to a direction of a normal line to the principal surface of the substrate and a direction of a c-axis of the substrate.

17 Claims, 11 Drawing Sheets

(51) Int. Cl.
  *H01L 29/423* (2006.01)
  *H01L 29/66* (2006.01)
  *H01L 29/739* (2006.01)
  *H01L 29/04* (2006.01)
  *H01L 29/16* (2006.01)
  *H01L 21/324* (2006.01)
  *H01L 21/302* (2006.01)
  *H01L 21/3065* (2006.01)
  *H01L 21/04* (2006.01)
  *H01L 21/28* (2006.01)
  *H01L 21/311* (2006.01)
  *H01L 21/687* (2006.01)
  *H01J 37/32* (2006.01)

(52) U.S. Cl.
  CPC .......... *H01L21/302* (2013.01); *H01L 21/3065* (2013.01); *H01L 21/31116* (2013.01); *H01L 21/324* (2013.01); *H01L 21/3247* (2013.01); *H01L 29/045* (2013.01); *H01L 29/1608* (2013.01); *H01L 29/4236* (2013.01); *H01L 29/66037* (2013.01); *H01L 29/66734* (2013.01); *H01L 29/7397* (2013.01); *H01J 37/32091* (2013.01); *H01L 21/68735* (2013.01)

(56) References Cited

U.S. PATENT DOCUMENTS

| | | | |
|---|---|---|---|
| 2005/0233539 A1* | 10/2005 | Takeuchi et al. | 438/400 |
| 2007/0057262 A1* | 3/2007 | Nakamura et al. | 257/77 |
| 2007/0187695 A1* | 8/2007 | Nakamura et al. | 257/77 |
| 2008/0220620 A1* | 9/2008 | Kawada et al. | 438/795 |
| 2009/0230404 A1* | 9/2009 | Masuda et al. | 257/77 |
| 2009/0317983 A1* | 12/2009 | Miyanagi et al. | 438/795 |
| 2010/0193862 A1 | 8/2010 | Kanazawa | |
| 2011/0017998 A1 | 1/2011 | Nakano et al. | |
| 2012/0161154 A1 | 6/2012 | Mimura et al. | |
| 2012/0181551 A1 | 7/2012 | Miyahara et al. | |
| 2013/0043490 A1 | 2/2013 | Sorada | |
| 2013/0062629 A1 | 3/2013 | Hiyoshi et al. | |
| 2013/0168699 A1 | 7/2013 | Nakano et al. | |
| 2013/0168701 A1 | 7/2013 | Kiyosawa et al. | |
| 2013/0270576 A1* | 10/2013 | Masuda et al. | 257/77 |
| 2013/0285069 A1* | 10/2013 | Yano et al. | 257/77 |
| 2013/0341648 A1* | 12/2013 | Saitoh et al. | 257/77 |
| 2014/0014972 A1 | 1/2014 | Nakano et al. | |

FOREIGN PATENT DOCUMENTS

| | | |
|---|---|---|
| JP | 2012-134376 A | 7/2012 |
| JP | 2012-146921 A | 8/2012 |
| JP | 2013-062392 A | 4/2013 |
| WO | 2012/026089 A1 | 3/2012 |
| WO | 2013/001677 A1 | 1/2013 |
| WO | 2013/042333 A1 | 3/2013 |

* cited by examiner

FIG. 1
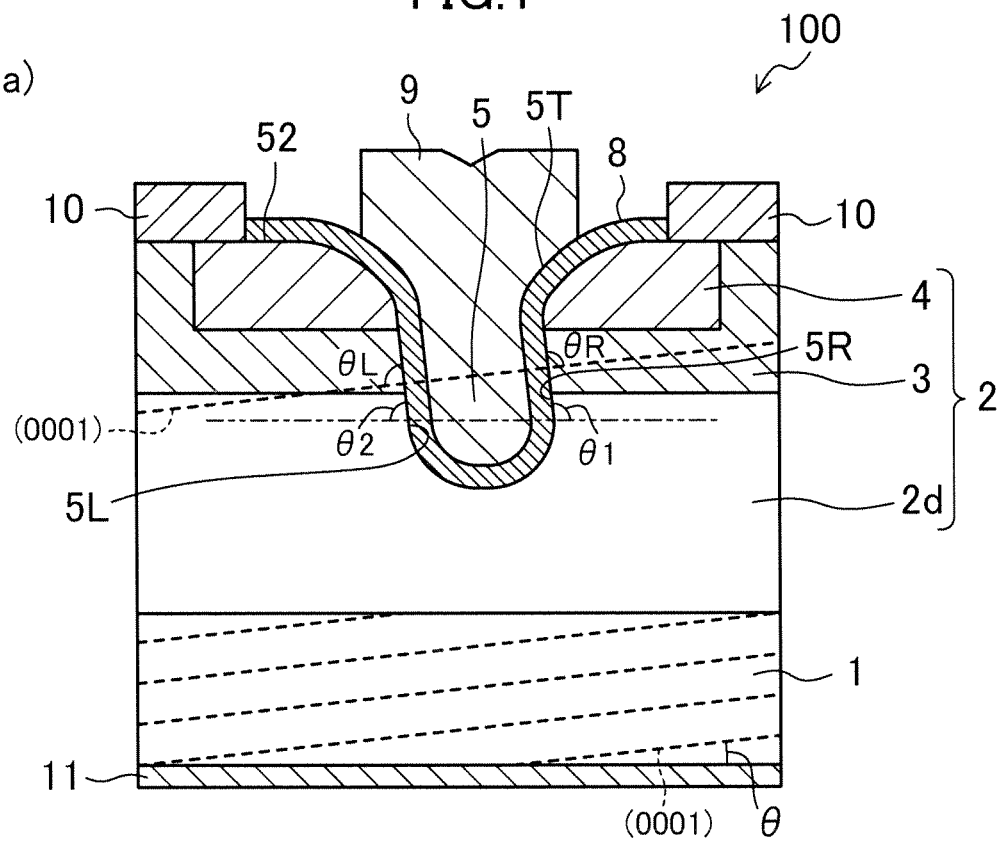
(a)
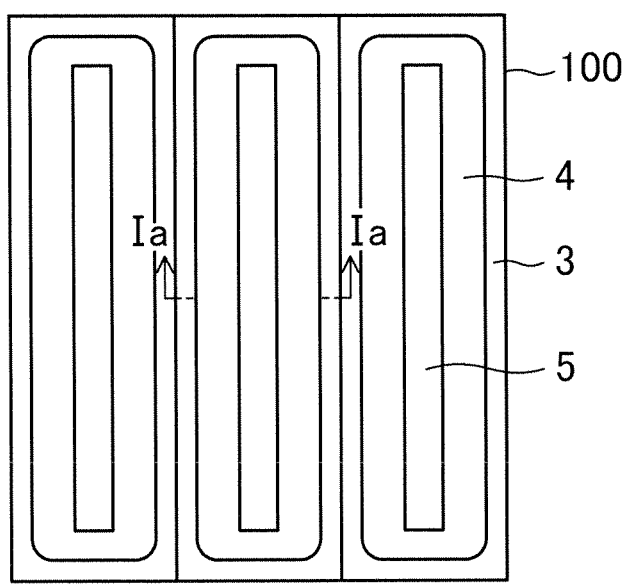
(b)

FIG.2
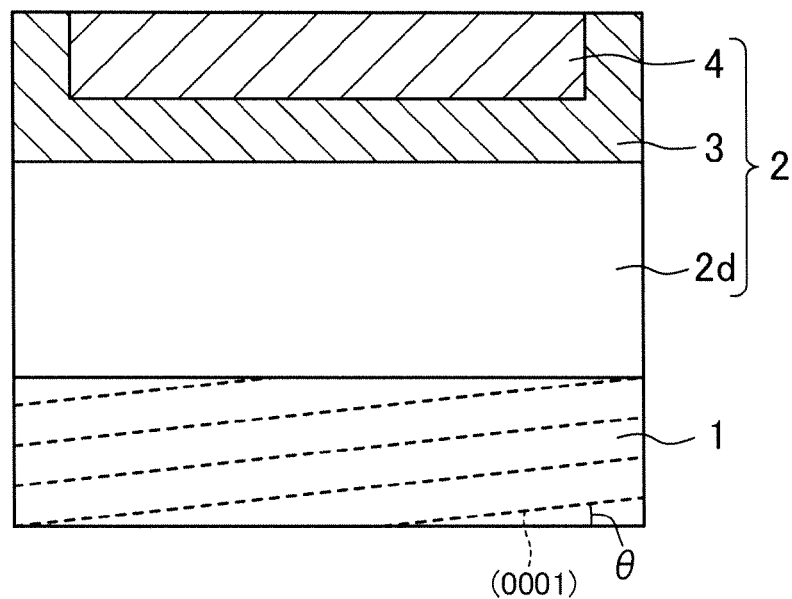
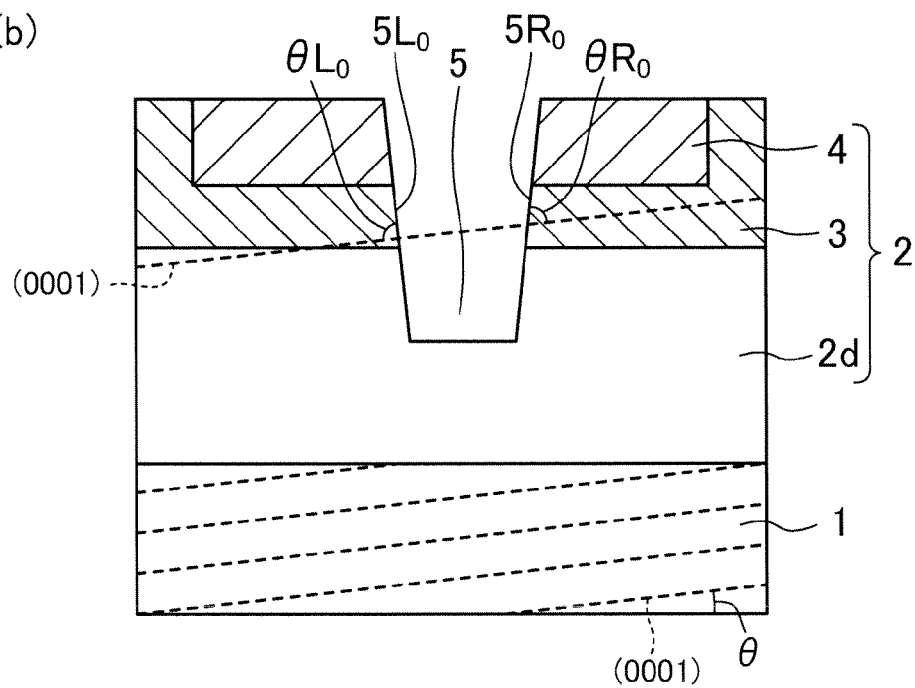

FIG.3
(a)
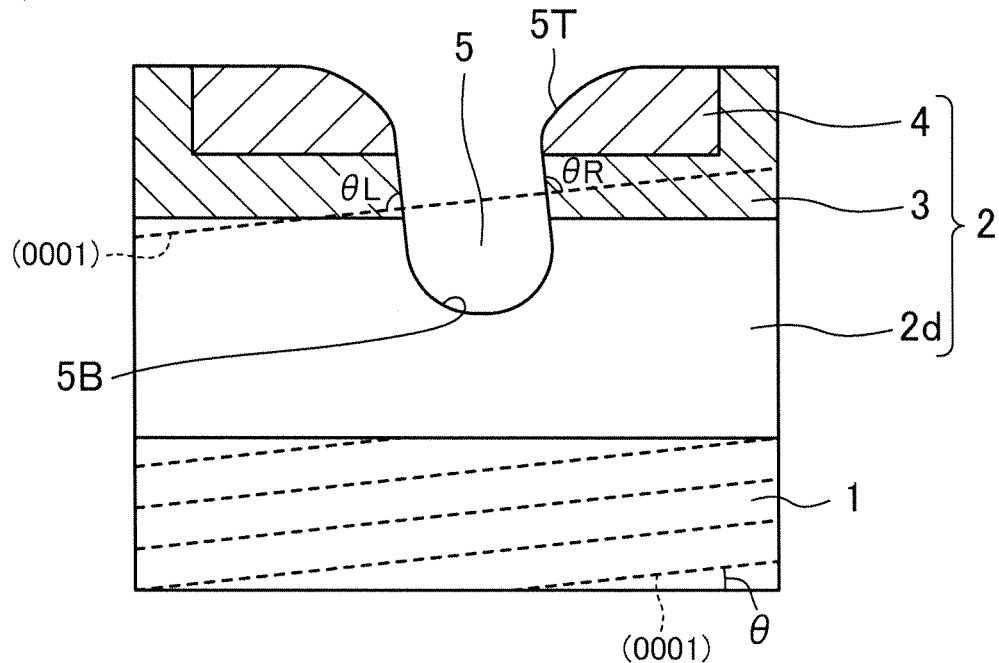
(b)
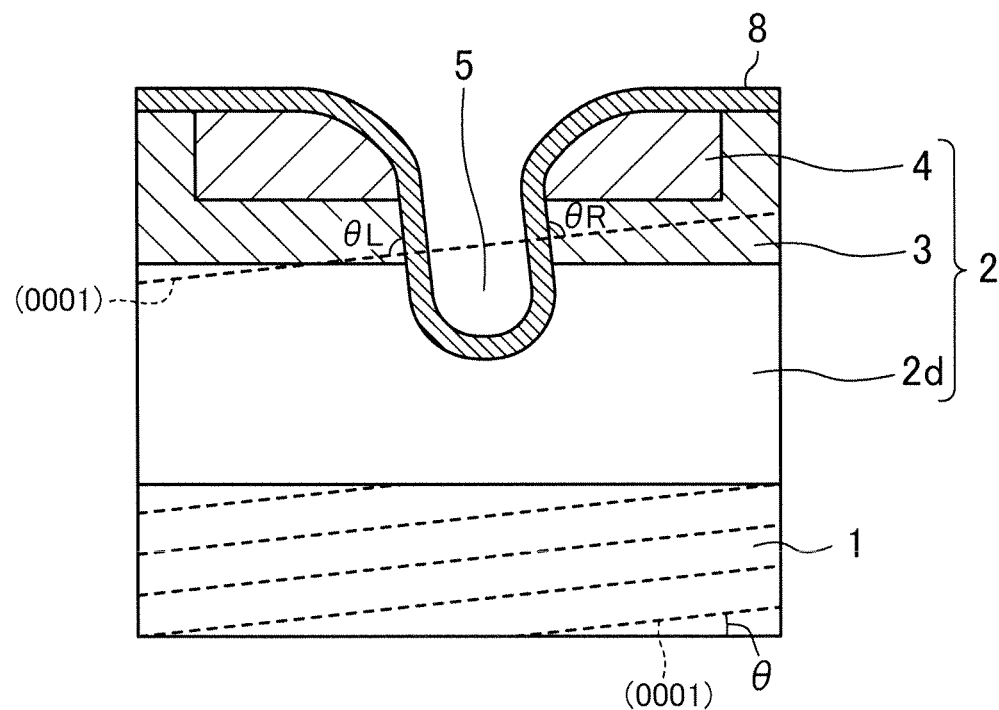

FIG.4
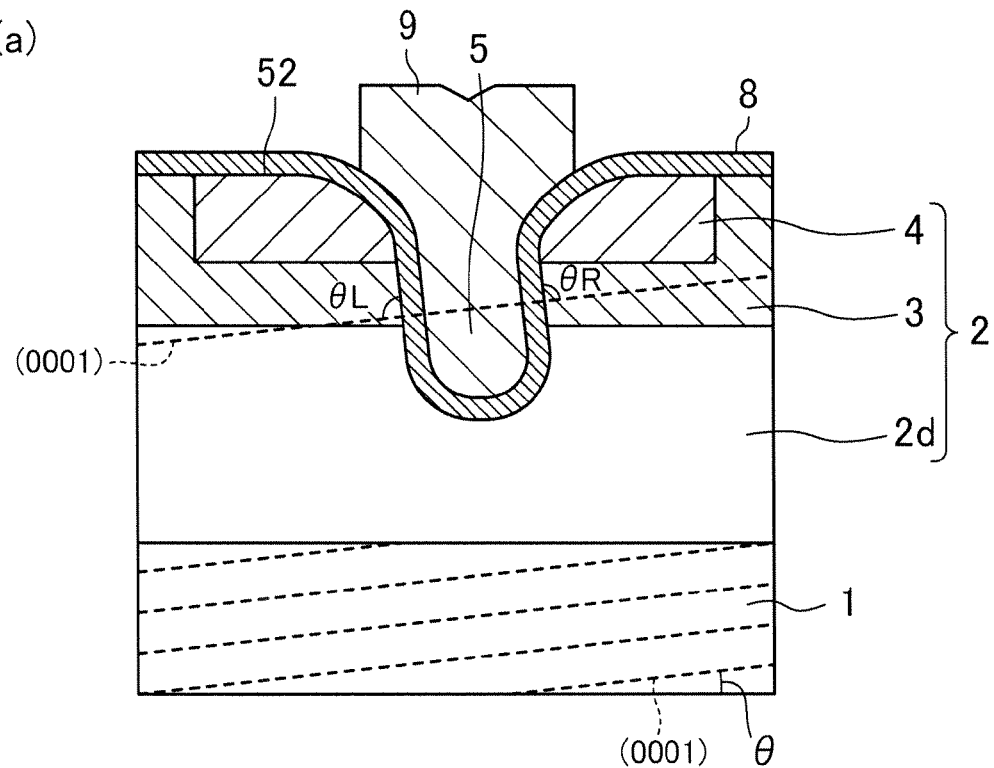
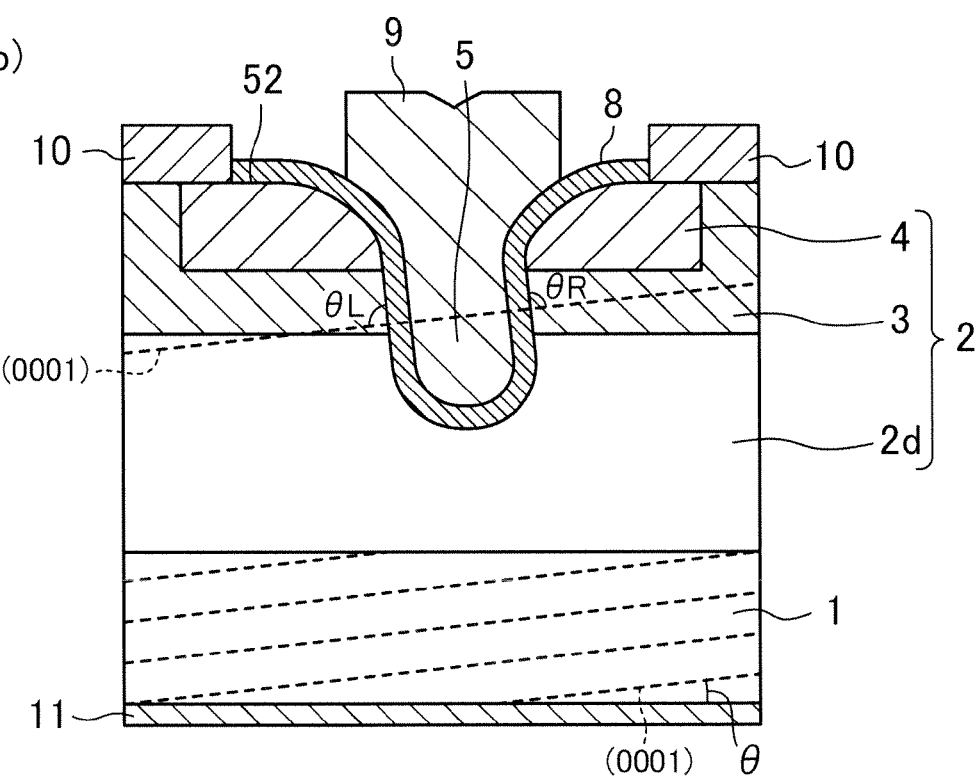

FIG.5
(a)
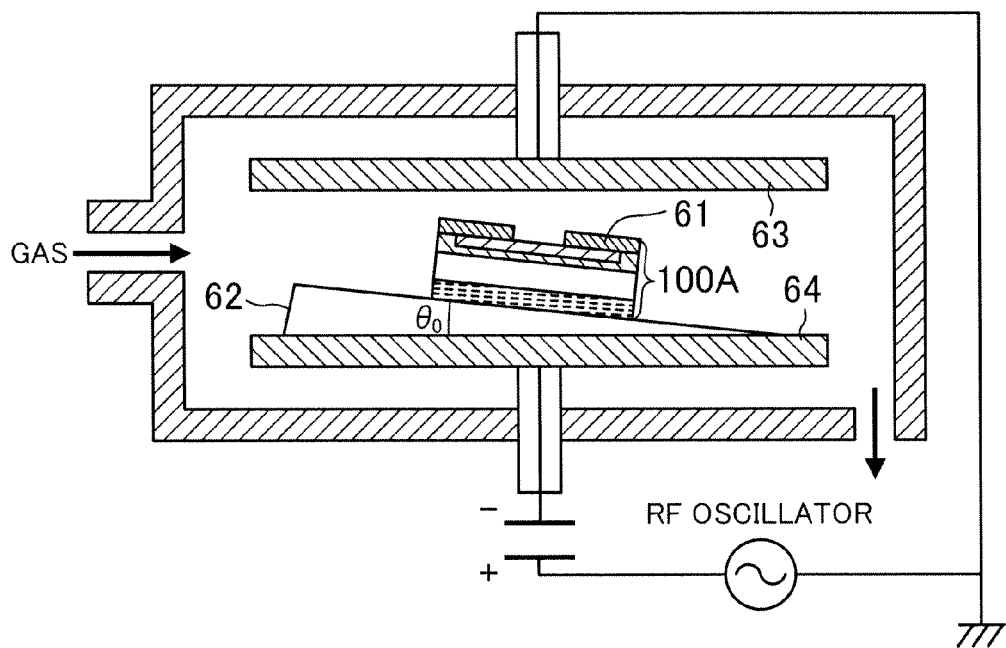
(b)
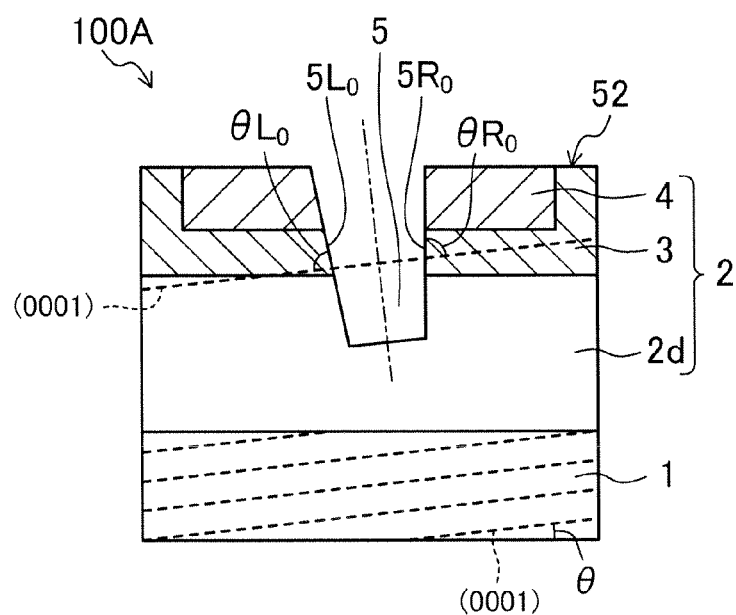

FIG.6
(a)
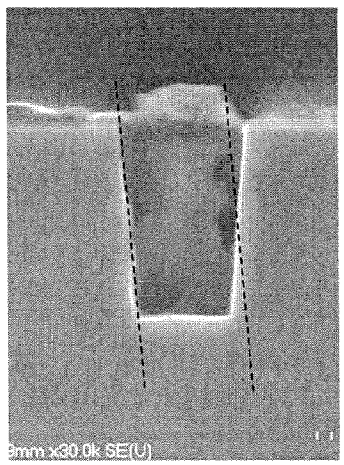
(b)
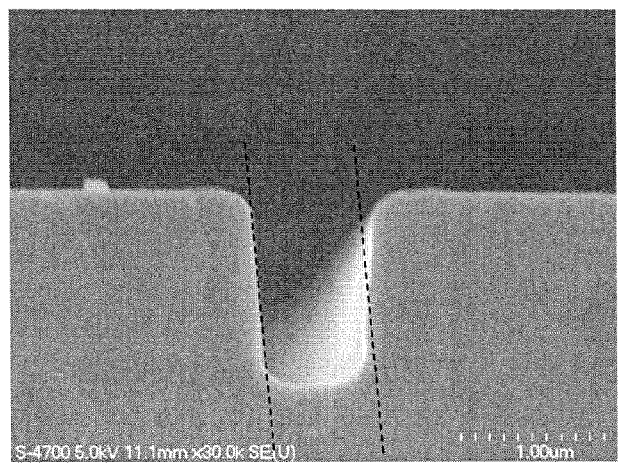
(c)
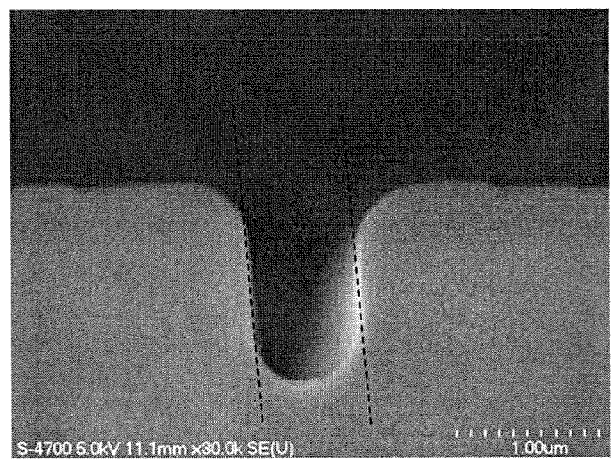

FIG.7
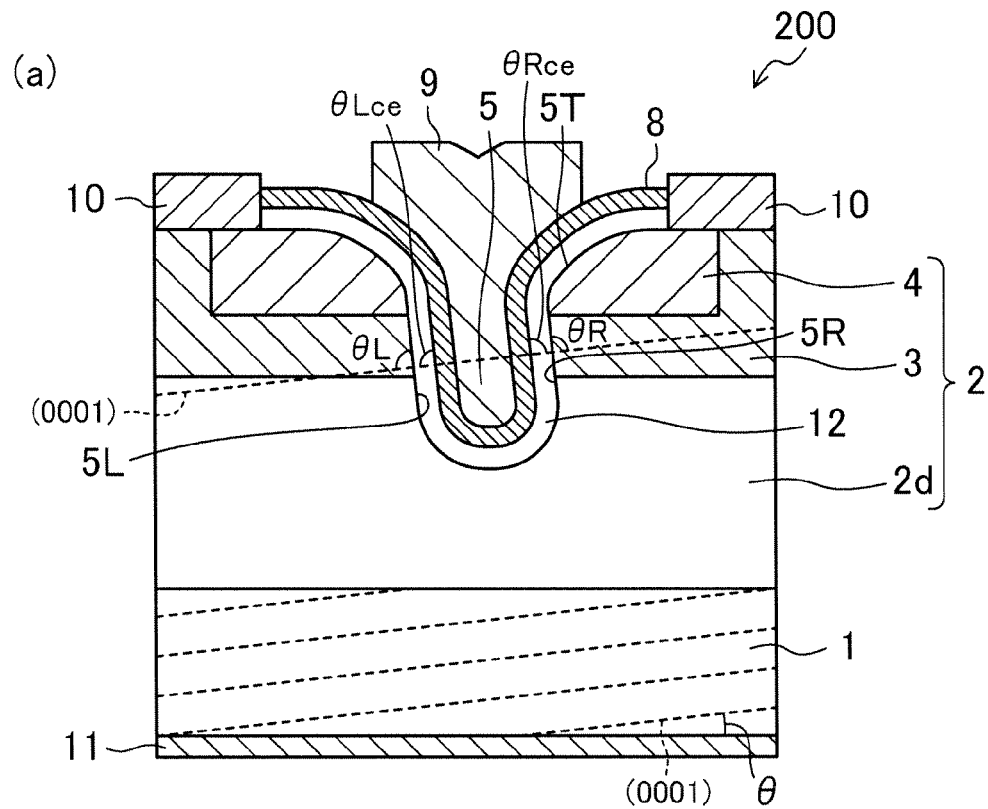
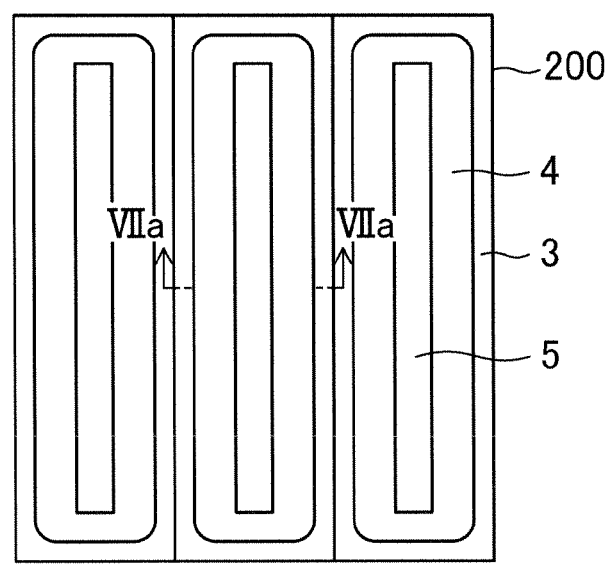

FIG.8
(a)
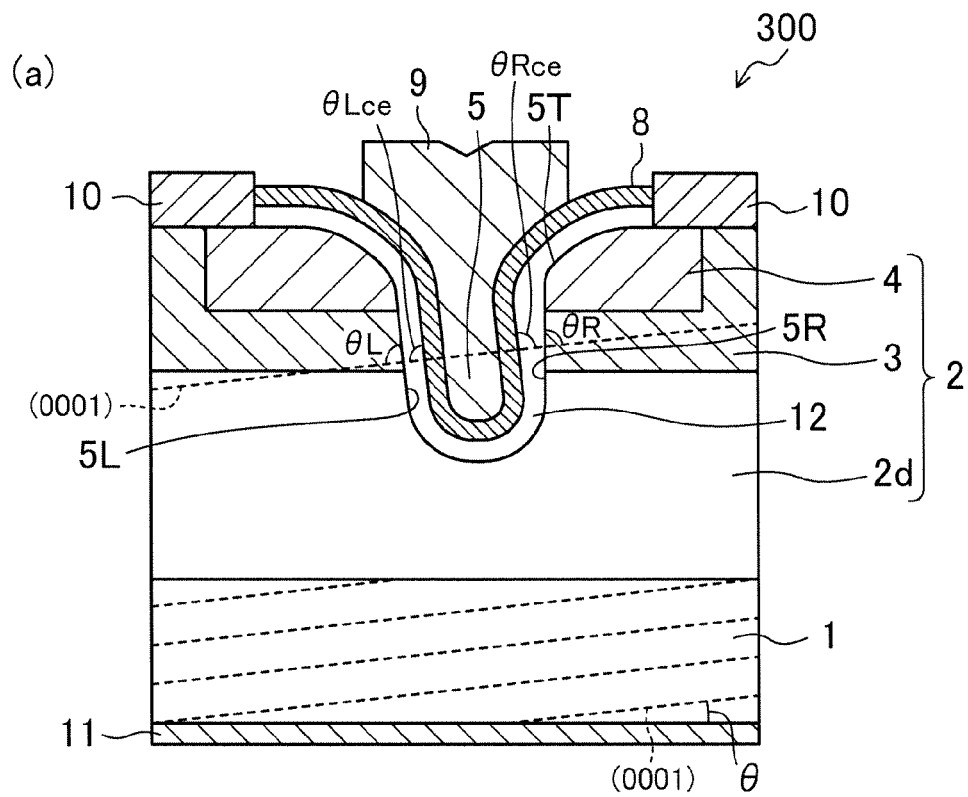
(b)
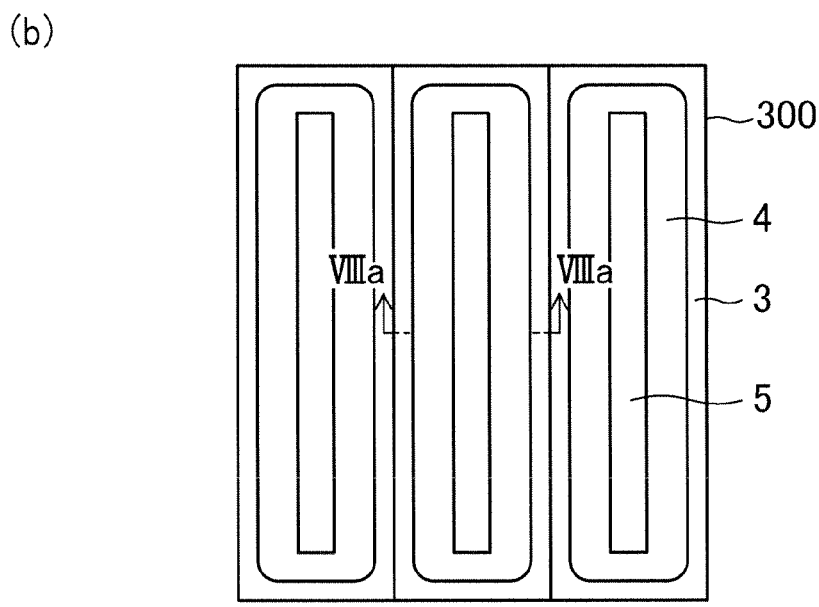

SEMICONDUCTOR DEVICE AND METHOD FOR MANUFACTURING SAME

RELATED APPLICATIONS

This application is the U.S. National Phase application under 35 U.S.C. §371 of International Application No. PCT/JP2013/007196, filed on Dec. 6, 2013, which in turn claims the benefit of Japanese Application No. 2013-095663, filed on Apr. 30, 2013, the disclosures of which Applications are incorporated by reference herein.

TECHNICAL FIELD

The present disclosure relates to semiconductor devices and methods for manufacturing the semiconductor devices, and specifically relates to semiconductor devices which withstand high voltage and high current and methods for manufacturing the semiconductor devices.

BACKGROUND ART

Silicon carbide (SiC) is a semiconductor material with a larger band gap and a greater dielectric breakdown field strength, compared to silicon (Si), and is therefore expected to be applied to next-generation low-loss power devices, etc. SiC includes various types of SiC, such as 3C—SiC (cubic system SiC), 6H—SiC (hexagonal system SiC) and 4H—SiC.

One of typical switching elements among power devices using SiC is a field effect transistor, such as a metal insulator semiconductor field effect transistor (hereinafter abbreviated as a "MISFET") or a metal semiconductor field effect transistor (hereinafter abbreviated as a "MESFET").

In such a switching element, the ON state in which a drain current of several amperes (A) or more flows and the OFF state in which the drain current is zero can be switched by a voltage applied between a gate electrode and a source electrode. Further, in the OFF state, the device can withstand a high voltage of several hundred volts (V) or more.

To make much higher current flow in the power device such as a MISFET, an increase in an integration density of the device is effective. Thus, vertical power MISFETs having a trench gate structure as a substitute for a conventional planar gate structure have been suggested. In the MISFET having the trench gate structure, a unit cell area can be reduced since a channel region is formed on a sidewall portion of a trench formed in a semiconductor layer. As a result, the integration density of the device can be increased.

Patent Document 1 discloses a method for reducing differences in plane orientation between both sidewalls of a trench by using a substrate with a small off-angle of equal to or larger than 0.3° and smaller than 4°, and preferably equal to or smaller than 1°.

Patent Document 2 discloses a method for reducing an effective off-angle approximately in half by forming a trench in a direction which forms an interior angle of 30° relative to the off direction.

CITATION LIST

Patent Document

Patent Document 1: Japanese Unexamined Patent Publication No. 2011-100967

Patent Document 2: Japanese Unexamined Patent Publication No. 2012-146921

SUMMARY OF THE INVENTION

Technical Problem

However, in the conventional methods, sometimes it is difficult to both use a substrate with a desired off-angle, and improve the carrier channel mobility in the sidewalls of the trench.

The present disclosure is thus intended to improve the carrier channel mobility in a sidewall portion of a trench which serves as a channel region, and reduce an on resistance in a semiconductor device using a substrate with a desired off-angle.

Solution to the Problem

To achieve the above objective, an aspect of a semiconductor device of the present disclosure includes: a substrate with an off-angle; a semiconductor layer provided on a principal surface of the substrate, including a first semiconductor region of a first conductivity type, and having a trench whose bottom is located in the first semiconductor region; and a gate electrode provided in the trench in the semiconductor layer, wherein in the trench in the semiconductor layer, a first angle formed by at least part of a first sidewall on an off-direction side and the principal surface of the substrate is an obtuse angle, and a second angle formed by at least part of a second sidewall opposite to the first sidewall and the principal surface of the substrate is an acute angle, in a cross section parallel to a direction of a normal line to the principal surface of the substrate and a direction of a c-axis of the substrate.

Further, an aspect of a method for manufacturing a semiconductor device of the present disclosure includes the steps of: forming a semiconductor layer including a first semiconductor region of a first conductivity type, on a principal surface of a substrate with an off-angle; forming, in the semiconductor layer, a trench whose bottom reaches the first semiconductor region; after forming the trench, performing an annealing process on the semiconductor layer, wherein in the step of performing the annealing process, an upper surface of an upper corner portion of the trench in the semiconductor layer is tilted downward to an inner side of the trench, and of a sidewall of the trench, a first sidewall on an off-direction side in a cross section parallel to a direction of a normal line to the principal surface of the substrate and a direction of a c-axis of the substrate is corrected to be close to a predetermined plane orientation, thereby making a first angle formed by at least part of the first sidewall and the principal surface of the substrate an obtuse angle, and a second angle formed by at least part of a second sidewall opposite to the first sidewall and the principal surface of the substrate an acute angle, in the cross section.

Advantages of the Invention

According to the semiconductor device of the present disclosure and the method for manufacturing the semiconductor device, in a trench type semiconductor device using a substrate with a desired off-angle, it is possible to improve the carrier channel mobility at a sidewall portion of a trench which forms a channel region and reduce an on resistance.

BRIEF DESCRIPTION OF THE DRAWINGS

FIG. 1(a) and FIG. 1(b) schematically illustrate a semiconductor device of an embodiment. FIG. 1(a) is a cross-sectional view taken along the line Ia-Ia of FIG. 1(b). FIG. 1(b) is a plan view.

FIG. 2(a) and FIG. 2(b) illustrate schematic cross-sectional views of the semiconductor device of the embodiment, for showing a method for manufacturing the semiconductor device in the order of steps.

FIG. 3(a) and FIG. 3(b) illustrate schematic cross-sectional views of the semiconductor device of the embodiment, for showing a method for manufacturing the semiconductor device in the order of steps.

FIG. 4(a) and FIG. 4(b) illustrate schematic cross-sectional views of the semiconductor device of the embodiment, for showing a method for manufacturing the semiconductor device in the order of steps.

FIG. 5(a) illustrates a schematic cross-sectional view of the semiconductor device of the embodiment, for showing a variation of the method for manufacturing the semiconductor device. FIG. 5(b) is a cross-sectional view of a substrate having a trench formed by the variation of the method for manufacturing the semiconductor device of the embodiment.

FIG. 6(a) through FIG. 6(c) show an example, showing scanning electron microscope (SEM) images of cross-sections of the trench in which the shape of the sidewalls is changed by an annealing process.

FIG. 7(a) and FIG. 7(b) schematically illustrate a semiconductor device of the first variation of the embodiment. FIG. 7(a) is a cross-sectional view taken along the line VIIa-VIIa of FIG. 7(b). FIG. 7(b) is a plan view.

FIG. 8(a) and FIG. 8(b) schematically illustrate a semiconductor device of the second variation of the embodiment. FIG. 8(a) is a cross-sectional view taken along the line VIIIa-VIIIa of FIG. 8(b). FIG. 8(b) is a plan view.

FIG. 9(a) is a plan view of a semiconductor layer (an SiC layer) provided with the trench. FIG. 9(b) is a schematic view illustrating a crystal orientation in a crystal structure. FIG. 9(c) is an enlarged cross-sectional view taken along the line IXc-IXc of FIG. 9(a).

FIG. 10(a) is a plan view of a semiconductor layer (an SiC layer) provided with the trench. FIG. 10(b) is a schematic view illustrating the crystal orientation in the crystal structure. FIG. 10(c) is an enlarged cross-sectional view taken along the line Xc-Xc of FIG. 10(a).

Figure 9:
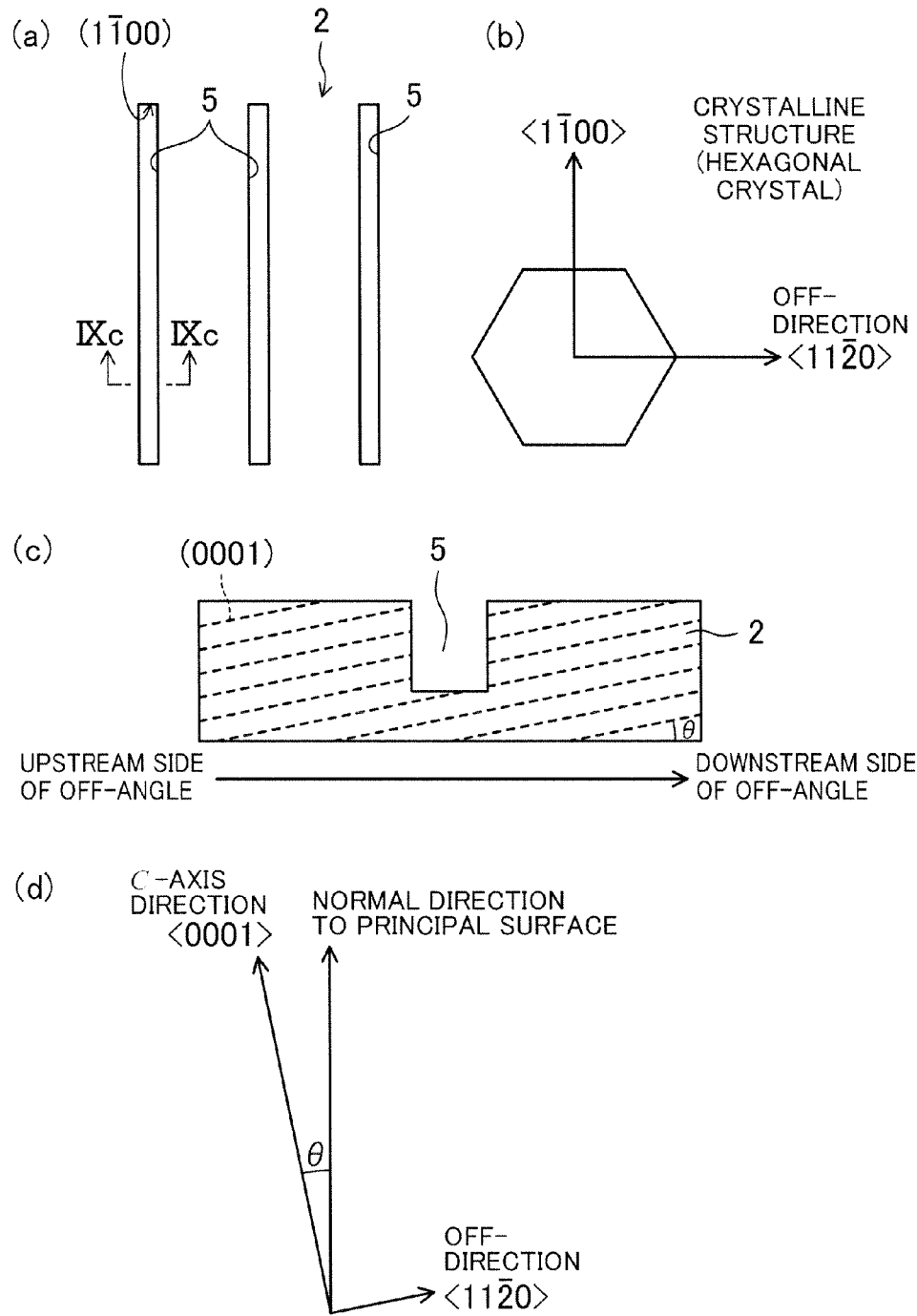
FIG. 9(a) through FIG. 9(c) schematically illustrate an example relationship between an off-direction of an off-angle set in a substrate forming a semiconductor device, and a plane orientation of a channel surface of a trench.
FIG. 9(d) shows a direction of a normal line to a principal surface of the semiconductor layer (the SiC layer), a c-axis direction, and an off-direction.

DESCRIPTION OF EMBODIMENTS (How the Inventors of the Present Disclosure Arrived at the Present Invention)

The inventors of the present invention conducted studies on typical semiconductor devices which are vertical MISFETs having a trench gate structure (hereinafter abbreviated as a trench type MISFET).

In the typical semiconductor devices, an SiC layer including an n type drift region and a p type body region is formed on an SiC substrate, and an n type source region is formed at part of an upper portion of the body region. Further, a trench which passes through the source region and the body region, a gate insulating film which covers the sidewall and the bottom of the trench, and a gate electrode buried in the trench and on the gate insulating film, are formed in the SiC layer.

For example, an off-angle SiC substrate whose principal surface is an off-angle plane that is tilted relative to the (0001) plane by about 4° to 8° in the <11-20> direction is used as the SiC substrate for the purpose of stable epitaxial growth of the SiC layer. In the present specification, for simplicity, the minus signs "-" associated with the Miller indices of the plane orientation and indices of the crystal axis represent the inversions of the indices following the minus signs.

The trenches are formed in stripes when viewed from above, such that a {11-20} plane with enhanced carrier channel mobility is formed in the sidewall of the trench.

In the case where a trench is formed in an off-angle SiC substrate to extend in a direction intersecting the off-direction, walls having the same plane orientation cannot be formed on the opposing sidewalls of the trench. For example, in the case where a trench is formed in an SIC substrate with an off-angle of 4° relative to the <11-20> direction of the crystal axis, such that the taper angle of the sidewall of the trench forms 86° with the principal surface of the substrate, the sidewall (the second sidewall) on the side opposite to the off-direction side can have a {11-20} plane as a plane orientation. On the other hand, the sidewall (the first sidewall) on the off-direction side has a plane tilted from a just plane, i.e., the {11-20} plane, by 8°. This difference in plane orientation may adversely affect the on resistance of the trench type MISFET. In the present specification, a plane having the same plane orientation as emerged in the semiconductor layer may be sometimes called a just plane.

Specifically, if the carrier channel mobility of the second sidewall of the trench is 1, the carrier channel mobility of the first sidewall with a different plane orientation is significantly smaller, i.e., about 0.3. The on resistance of the trench type MISFET is therefore increased, and the possible performance of the semiconductor device cannot be fully derived. To improve the carrier channel mobility of the trench sidewall to the fullest, reducing the difference in plane orientation from the plane orientation of the {11-20} just plane is desired.

That is, achieving both of stable epitaxial growth and an improvement in the carrier channel mobility in both sidewalls of the trench is difficult because there is a trade-off relationship between the stable epitaxial growth and the improvement in the carrier channel mobility in both sidewalls of the trench.

The present inventors conducted intensive studies on the above problem, and reached the semiconductor device which will be described below.

General Description of Embodiment

A semiconductor device of an embodiment includes: a semiconductor device, comprising: a substrate with an off-angle; a semiconductor layer provided on a principal surface of the substrate, including a first semiconductor region of a first conductivity type, and having a trench whose bottom is located in the first semiconductor region; and a gate electrode provided in the trench in the semiconductor layer, wherein in the trench in the semiconductor layer, a first angle formed by at least part of a first sidewall on an off-direction side and the principal surface of the substrate is an obtuse angle, and a second angle formed by at least part of a second sidewall opposite to the first sidewall and the principal surface of the substrate is an acute angle, in a cross section parallel to a direction of a normal line to the principal surface of the substrate and a direction of a c-axis of the substrate.

In the above semiconductor device, in the trench in the semiconductor layer, a first angle formed by at least part of a first sidewall on an off-direction side and the principal surface of the substrate is an obtuse angle, and a second angle formed by at least part of a second sidewall opposite to the first sidewall and the principal surface of the substrate is an acute angle, in a cross section parallel to a direction of a normal line to the principal surface of the substrate and a direction of a c-axis of the substrate. Thus, a difference in plane orientation of the taper angle between opposed sidewalls of the trench which are opposed to each other in the off-direction can be reduced even if a substrate with an off-angle is used. It is thus possible to ensure good carrier channel mobility, and obtain a semiconductor device with less on resistance.

In an embodiment, a tilt of an orientation of each of the at least part of the first sidewall and the at least part of the second sidewall relative to a {11-20} plane or a {1-100} plane may be smaller than the off-angle.

In an embodiment, an upper surface of an upper corner portion of the trench in the semiconductor layer may be tilted downward to an inner side of the trench.

A semiconductor device of an embodiment may further include a gate insulating film provided between the sidewalls of the trench in the semiconductor layer and the gate electrode, wherein the semiconductor layer may include a drift region which is the first semiconductor region, a body region of a second conductivity type provided on the drift region, and a second semiconductor region of the first conductivity type provided in an upper portion of the body region, the trench may pass through the second semiconductor region and the body region and reach the drift region, and the body region may be provided at the at least part of the first sidewall and the at least part of the second sidewall.

In this case, the semiconductor device may further include a drain electrode provided on a surface of the substrate opposite to the surface where the semiconductor layer is provided; and a source electrode provided on the second semiconductor region and the body region, wherein the second semiconductor region may be a source region, and the substrate may have the first conductivity type.

In an embodiment, in the trench in the semiconductor layer, a tilt of an orientation of each of the at least part of the first sidewall and the at least part of the second sidewall relative to a {11-20} plane or a {1-100} plane may be less than or equal to 4°.

In an embodiment, in the case where a gate insulating film is provided, the semiconductor layer may include a channel layer provided at at least a region between the body region and the gate insulating film and made of semiconductor of the first conductivity type.

In this case, the thickness of the channel layer on the first sidewall and the thickness of the channel layer on the second sidewall may differ from each other.

A method for manufacturing a semiconductor device of an embodiment includes the steps of: forming a semiconductor layer including a first semiconductor region of a first conductivity type, on a principal surface of a substrate with an off-angle; forming, in the semiconductor layer, a trench whose bottom reaches the first semiconductor region; and after forming the trench, performing an annealing process on the semiconductor layer, wherein in the step of performing the annealing process, an upper surface of an upper corner portion of the trench in the semiconductor layer is tilted downward to an inner side of the trench, and of a sidewall of the trench, a first sidewall on an off-direction side in a cross section parallel to a direction of a normal line to the principal surface of the substrate and a direction of a c-axis of the substrate is corrected to be close to a predetermined plane orientation, thereby making a first angle formed by at least part of the first sidewall and the principal surface of the substrate an obtuse angle, and a second angle formed by at least part of a second sidewall opposite to the first sidewall and the principal surface of the substrate an acute angle, in the cross section.

According to the above method for manufacturing a semiconductor device, in the step of performing the annealing process, an upper surface of an upper corner portion of the trench in the semiconductor layer is tilted downward to an inner side of the trench, and of a sidewall of the trench, a first sidewall on an off-direction side in a cross section parallel to a direction of a normal line to the principal surface of the substrate and a direction of a c-axis of the substrate is corrected to be close to a predetermined plane orientation, thereby making a first angle formed by at least part of the first sidewall and the principal surface of the substrate an obtuse angle, and a second angle formed by at least part of a second sidewall opposite to the first sidewall and the principal surface of the substrate an acute angle, in the cross section. Thus, a difference in plane orientation of the taper angle between opposed sidewalls of the trench which are opposed to each other in the off-direction can be reduced even if a substrate with an off-angle is used. It is thus possible to ensure good carrier channel mobility, and obtain a semiconductor device with less on resistance.

The method for manufacturing the semiconductor device of the embodiment may further include the steps of: after the step of performing the annealing process, forming a gate insulating film to cover the sidewalls of the trench; and forming a gate electrode on the gate insulating film inside the trench, wherein the semiconductor layer may include a drift region which is the first semiconductor region, a body region of a second conductivity type formed on the drift region, and a second semiconductor region of the first conductivity type formed in an upper portion of the body region, the trench may pass through the second semiconductor region and the body region and reach the drift region, and the body region may be formed at the at least part of the first sidewall and the at least part of the second sidewall.

In this case, the method may further include the steps of: forming a drain electrode on a surface of the substrate opposite to the surface where the semiconductor layer is formed; and forming a source electrode on the second semiconductor region and the body region, wherein the second semiconductor region may be a source region, and the substrate may have the first conductivity type.

In the method for manufacturing the semiconductor device of the embodiment, in the step of forming the trench, the trench may be formed by dry etching, and an angle formed by a voltage application direction in the dry etching and the direction of the c-axis of the substrate may be set to be smaller than the off-angle.

In the method for manufacturing the semiconductor device of the embodiment, the annealing process may be performed in an inert gas atmosphere.

In the method for manufacturing the semiconductor device of the embodiment, the annealing process may be performed at 1500° C. or more and 1600° C. or less.

The method for manufacturing the semiconductor device of the embodiment may further include the step of: before the step of forming the gate insulating film and after the step of performing the annealing process, forming a channel layer made of semiconductor of the first conductivity type on the sidewalls of the trench.

In this case, in the step of forming the channel layer, the channel layer may be formed such that a tilt of an orientation of an interface between the gate insulating film and the channel layer at a sidewall portion of the trench on the off-direction side, relative to a {11-20} plane or a {1-100} plane, may be less than or equal to 4°.

In the method for manufacturing the semiconductor device of the embodiment, the direction of the c-axis may be a <0001> direction, and the off-direction may be a <11-20> direction or a <1-100> direction.

In the method for manufacturing the semiconductor device of the embodiment, the substrate and the semiconductor layer may be made of silicon carbide.

Explanation of Terms

The term "off-angle" means an angle formed by a normal line to a principal surface of a substrate and the c-axis of the substrate. Further, an angle formed by the principal surface of the substrate and a crystal plane (a plane perpendicular to the c-axis) may also be called an off-angle. For example, if the c-axis direction is a <0001> direction, the angle formed by the principal surface of the substrate and a {0001} plane is also called an off-angle.

The term "off-direction" means a direction of a projected vector obtained by projecting a vector of the normal line of the substrate's principal surface onto the crystal plane (the plane perpendicular to the c-axis). For example, if the c-axis direction is the <0001> direction, the direction of the projected vector obtained by projecting the vector of the normal line to the substrate's principal surface onto the {0001} plane is an off-direction.

The off-direction of the substrate and a plane orientation of a channel surface of a trench will be described using FIG. 9(a) through FIG. 9(d) and FIG. 10(a) through FIG. 10(d).

As shown in FIG. 9(a) and FIG. 9(b), a plurality of trenches 5 are formed in an upper portion of an SiC layer 2 such that they extend in a <1-100> direction and are arranged in parallel with and apart from each other. As shown in FIG. 9(c) and FIG. 9(d), in the SiC layer 2, an off-angle θ relative to a (0001) plane is formed in a <11-20> direction. That is, the direction of extension of the plurality of trenches 5 is perpendicular to the off-direction of the SiC layer 2 (the substrate).

Further, as shown in FIG. 10(a) through FIG. 10(d), the plurality of trenches 5 are formed to extend in the <11-20> direction, and the off-angle of the substrate is set to the <1-100> direction.

In the following embodiment, an example in which the off-direction of the substrate is the <11-20> direction will be described, but the off-direction of the substrate may be the <1-100> direction.

Figure 11:
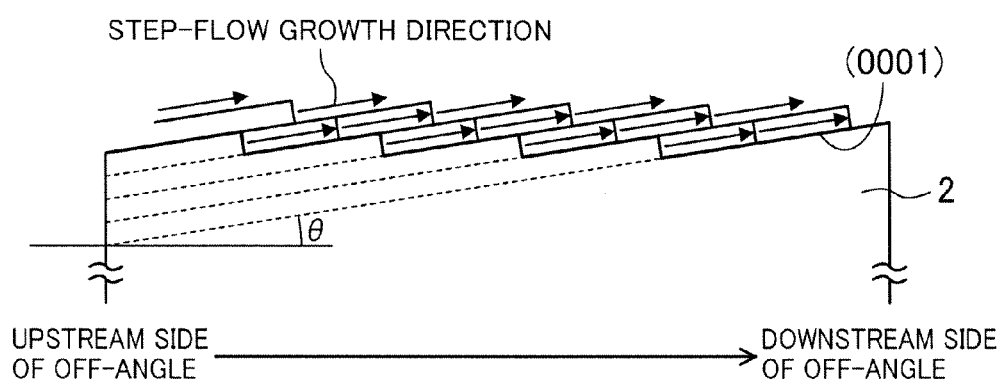
FIG. 11 is an enlarged cross-sectional view for schematically explaining a step-flow (atomic step) growth direction in a step of epitaxial growth, and an upstream side of the off-angle and a downstream side of the off-angle.

Next, the terms "upstream side of the off-angle" and "downstream side of the off-angle" in forming, on a crystalline substrate with an off-angle, a semiconductor layer having the same off-angle will be described. FIG. 11 shows a schematic cross-sectional view in forming, by step-flow growth, a semiconductor layer 2 on a substrate 1 with an off-angle θ relative to the (0001) plane. The epitaxial growth of the semiconductor layer 2 on a principal surface of the substrate 1 with the off-angle θ proceeds in the off-direction by the step-flow growth mode forming atomic steps. When viewed along the in-plane of the principal surface of the substrate 1 or the semiconductor layer 2, growth of the semiconductor layer 2 proceeds from the left side (an upstream side) to the right side (a downstream side) in the drawings That is, when the cross section is viewed such that the (0001) plane slopes upward to the right, the left side is the upstream side of the off-angle, and the right side is the downstream side of the off-angle. In other words, the projected vector obtained by projecting the vector of the off-direction on the principal surface of the substrate extends in a direction from the upstream side to the downstream side of the off-angle. In the present specification, the atomic step includes step bunching in which a plurality of atomic steps overlap one another.

In the following description, for the simplicity of description, the sidewall of the trench may sometimes be referred to as a "sidewall on the upstream side of the off-angle" or a "sidewall on the downstream side of the off-angle" to specify the sidewall. The "sidewall on the downstream side of the off-angle" means a sidewall (a first sidewall) on the off-direction side, when viewed from a cross section parallel to the normal line to the principal surface of the substrate and to the c-axis of the substrate. The "sidewall on the upstream side of the off-angle" means a sidewall (a second sidewall) on the opposite side to the off-direction side, when viewed from the same cross section.

In the case of a trench type MISFET, the channel region is formed in a semiconductor region near the interface between the semiconductor region in which a trench is formed and a gate insulating film deposited on the sidewall of the trench. Thus, the plane orientation of the sidewall of the trench is a plane orientation of the interface between the gate insulating film on the sidewall and the semiconductor region. In the following description of the present specification, the interface between the gate insulating film on the sidewall of the trench and the semiconductor region may also be called a "MIS interface."

Embodiment

Structure of Semiconductor Device

A semiconductor device of the present embodiment will be described below, with reference to FIG. 1(a) and FIG. 1(b).

A semiconductor device 100 as an example of an SiC semiconductor device is a metal insulator semiconductor field effect transistor (MISFET) made of SiC and having a trench gate structure, and has a plurality of unit cells.

FIG. 1(a) schematically shows a cross-sectional configuration corresponding to one unit cell in the semiconductor device 100. FIG. 1(b) schematically shows an example plan configuration of a surface of an SiC layer of the semiconductor device 100 on which a plurality of unit cells (three in this example) are arranged.

In FIG. 1(b), some of elements are omitted, and an arrangement of only a body region 3, a source region 4, and a trench 5 is shown. Here, the planar shape of the unit cell including the trench 5 is in a rectangular shape. However, the planar shape of the unit cell is not limited to the rectangular shape, and may be other shapes, such as square or polygonal shape, for example.

As shown in FIG. 1(a), the semiconductor device 100 of the present embodiment is formed using a substrate 1 with an off-angle θ. As the substrate 1, for example, a substrate made of SiC (also simply referred to as a SiC substrate) of a first conductivity type (n type) having a (0001) silicon (Si) plane with an off-angle θ as a principal surface, can be used. However, the substrate 1 is not limited to this substrate, and may be an SiC substrate having a carbon (C) plane as a principal surface, or may be a substrate having any polytype structure. In this embodiment, a 4H—SiC substrate is used as an example. As for the off-angle, for example, a substrate of which the off-direction is a <11-20> direction and the off-angle is 4° relative to the (0001) plane is used. The off-direction may also be a <1-100> direction, and the off-angle may also be 8° or 2°, or other angles.

An SiC layer 2 which is an epitaxial layer, for example, is provided on the principal surface of the substrate 1 with the off-angle. The broken lines shown in the substrate 1 indicate (0001) just planes.

The SiC layer 2 includes a first conductivity type (n type) drift region 2d provided on the principal surface of the substrate 1, a second conductivity type (p type) body region 3 provided on the drift region 2d (a first semiconductor region), and a first conductivity type (n type) source region 4 (a second semiconductor region) provided in an upper portion of the body region 3. Here, the conductivity type of the substrate 1 is a first conductivity type (n type), and the impurity concentration of the substrate 1 is set to be higher than that of the drift region 2d.

In the example shown in FIG. 1(a), a bottom surface and a side surface of the source region 4 is surrounded by the body region 3. The SiC layer 2 is a semiconductor layer epitaxialy grown on the principal surface of the substrate 1, but the body region 3 may be formed by implanting p type impurity ions and the source region 4 may be formed by implanting n type impurity ions in an upper portion on the principal surface side of the substrate 1 without using epitaxial growth.

A trench 5 which passes through the source region 4 and the body region 3 from a principal surface 52 that is an Si surface, and reaches the drift region 2d, is formed in the SiC layer 2. The trench 5 is formed to intersect with the off-direction of the substrate. In the example shown in FIG. 1, the off-direction is a <11-20> direction.

In the present embodiment, a first angle θ1 formed by a trench sidewall 5R on the downstream side (off-direction side) of the off-angle and the principal surface of the substrate 1, and a second angle θ2 formed by a trench sidewall 5L on the upstream side (opposite side to the off-direction side) of the off-angle and the principal surface of the substrate 1 are different from each other. More specifically, the first angle θ1 is larger than the second angle θ2. Of the angle formed by the trench sidewall on the off-direction side and the principal surface of the substrate 1, the first angle θ1 corresponds not to an angle formed in the trench 5, but to an angle of a portion including the SiC layer 2 forming the sidewall, that is, an angle opening to the off-direction side. Of the angle formed by the trench sidewall on the opposite side of the off-direction side, the second angle θ2 corresponds not to an angle formed in the trench 5, but to an angle of a portion including the SiC layer 2 forming the sidewall, that is, a supplementary angle of the angle opening to the off-direction side.

In the example shown in FIG. 1, since the trench sidewall 5R on the downstream side of the off-angle is reverse-tapered, and the trench sidewall 5L on the upstream side of the off-angle is tapered, the first angle θ1 is an obtuse angle and the second angle θ2 is an acute angle. Further, since the trench sidewall 5R on the downstream side of the off-angle and the trench sidewall 5L on the upstream side of the off-angle are formed approximately in parallel to each other, the supplementary angle of the first angle θ1 and the second angle θ2 are approximately equal to each other.

For the above reasons, the trench sidewall 5L on the upstream side of the off-angle and the trench sidewall 5R on the downstream side of the off-angle of the trench 5 have a plane of which a tile from a {11-20} just plane is 4° or less, for example. In terms of improving the carrier channel mobility in the trench sidewalls 5L, 5R in the body region 3, the tilt may be 2° or less, or may be 1° or less. In other words, as shown in FIG. 1(a), if the angle formed by the trench sidewall 5L on the upstream side of the off-angle and the (0001) just plane is θL, and the angle formed by the trench sidewall 5R on the downstream side of the off-angle and the (0001) just plane is θR, each of the angles θL, θR may be 86° or more and 94° or less. Each of the angles θL, θR may also be 88° or more and 92° or less, or may be 89° or more and 91° or less. That is, the tilt of each of the angles θL, θR from the {11-20} just plane may be 4° or less, 2° or less, or 1° or less. Further, the first angle θ1 does not have to be an obtuse angle, and the first angle θ1 and the second angle θ2 may be different acute angles. Further, the trench sidewall 5R on the downstream side of the off-angle and the trench sidewall 5L on the upstream side of the off-angle do not have to be formed approximately in parallel to each other.

Further, tilts of orientations of at least part of the trench sidewall 5R (the first sidewall) on the downstream side of the off-angle, and at least part of the trench sidewall 5L (the second sidewall) on the upstream side of the off-angle, relative to the {11-20} just plane, may be smaller than the off-angle relative to the off-angle. The at least part of the trench sidewall 5R and the at least part of the trench sidewall 5L may be, for example, portions of the trench sidewall 5R and the trench sidewall 5L formed in the body region 3.

An upper corner portion 5T of the trench 5 is tilted downward to the inner side of the trench 5. A gate insulating film 8 is formed inside the trench 5 to cover at least the sidewall portion of the trench 5. As mentioned above, in the case of a MISFET, the channel region is formed in a region near the interface (the MIS interface) between the gate insulating film 8 and the sidewall portion of the trench 5 in the body region 3. The gate insulating film 8 may be, for example, a thermal oxidation film, such as a silicon oxide film formed by thermal oxidation or a silicon oxide film including nitrogen (N), or an insulating film deposited.

A gate electrode 9 is formed on the gate insulating film 8 provided inside the trench 5. It is sufficient if the gate electrode 9 is formed to cover at least a region facing the body region 3. In this embodiment, the gate electrode 9 is formed to fill the trench 5 as an example. Thus, the gate electrode 9 and the SiC layer 2 are insulated from each other by the gate insulating film 8.

A source electrode 10 which applies the same electric potential to the body region 3 and the source region 4 is provided on the SiC layer 2 such that the source electrode 10 is in contact with both of the body region 3 and the source region 4. A drain electrode 11 is provided on a surface (a back surface) of the substrate 1 opposite to the surface where the SiC layer 2 is formed.

The semiconductor device 100 is a trench type MISFET having the above configurations. Thus, if the source electrode 10 is connected to a ground electric potential, and a bias voltage lower than a threshold voltage is applied to the gate electrode 9, it leads to an accumulation state in which holes are induced in a region of the body region 3 near the MIS interface with the gate insulating film 8, between the source region 4 and the drift region 2d. In this state, a current does not flow (i.e., an off state) since the path of electrons as conduction carriers is blocked.

In contrast to this, if a bias voltage higher than or equal to the threshold voltage is applied to the gate electrode 9, it leads to an inversion state in which electrons are induced in a region of the body region 3 near the MIS interface with the gate insulating film 8, between the source region 4 and the drift region 2d, and an inversion layer is formed. As a result, carriers (electrons) flow (i.e., an on state) sequentially in the source electrode 10, the source region 4, the inversion layer (not shown) which is formed in the body region 3 and is in contact with the gate insulating film 8, the drift region 2d, the substrate 1, and the drain electrode 11.

In the semiconductor device 100 of the present embodiment, both of the trench sidewall 5L on the upstream side of the off-angle and the trench sidewall 5R on the downstream side of the off-angle have a plane close to the {11-20} just plane. It is thus possible to ensure high carrier channel mobility at the MIS interfaces of both of the opposed sidewalls of the trench 5. As a result, it is possible to provide a trench type MISFET with less on resistance and capable of allowing a large current to flow.

Further, in the semiconductor device 100 of the present embodiment, the MIS interface of each of the sidewalk is improved due to the shape of the trench 5. Thus, for example, a substrate 1 with a desired off-angle can be used for the purpose of stable epitaxial growth. For example, even in the case where a substrate 1 with a relatively large off-angle is used to reduce crystal defects such as a triangular defect formed in an epitaxial film, adopting the above-described shape of the trench 5 can improve the carrier mobility in the MIS interface of each of the sidewalls of the trench 5. In other words, both the stable epitaxial growth and the improvement in carrier mobility can be achieved.

Method for Manufacturing Semiconductor Device

A method for manufacturing the semiconductor device of the present embodiment will be described with reference to FIG. 2(a), FIG. 2(b), FIG. 3(a), FIG. 3(b), FIG. 4(a), and FIG. 4(b).

First, as shown in FIG. 2(a), the SiC layer 2 including the drift region 2d, the body region 3, and the source region 4 is formed on the principal surface of the substrate 1 with the off-angle θ. As an example substrate 1, a 4H—SiC substrate of a first conductivity type (n type) having an off-angle of 4° relative to the (0001) plane is used. The off-direction is, for example, a <11-20> direction. The n type SiC layer 2 is formed on a (0001) Si surface of such a substrate 1 by a method, such as a chemical vapor deposition (CVD) method, which enables epitaxial growth. For example, the SiC layer 2 has a carrier density of $8\times10^{15}$ cm$^{-3}$, and a thickness of 12 μm. For example, nitrogen (N) ions can be used as an n type dopant.

Next, the body region 3 of a second conductivity type (p type) is formed in an upper portion of the SiC layer 2. For example, the body region 3 has a carrier density of $1\times10^{18}$ cm$^{-3}$, and a thickness of 1.2 μm. To form the body region 3, aluminum (Al) ions, for example, as a p type dopant are implanted in the SiC layer 2. Of the SiC layer 2, the region other than the region where the body region 3 is formed becomes the drift region 2d. The body region 3 may be formed on the n type SiC layer 2 by epitaxial growth, while supplying a p type dopant such as trimethylaluminum (TMA).

Next, the n type source region 4 is selectively formed in an upper portion of the body region 3. For example, the source region 4 has a carrier density of $5\times10^{19}$ cm$^{-3}$, and a thickness of 0.6 μm. To form the source region 4, N ions, for example, as an n type dopant are implanted in the body region 3, using a mask film (not shown) formed on the SiC layer 2 and made of silicon oxide or polysilicon. After that, for example, an annealing process is performed under an inert gas atmosphere and at a temperature of 1700° C. for about 30 minutes. Due to the annealing process, the impurity ions implanted in the body region 3 and the source region 4 are activated.

Next, as shown in FIG. 2(b), the trench 5 is formed in the SiC layer 2. In this example, the trench 5 is formed such that it passes through the source region 4 and the body region 3, and that the bottom of the trench 5 reaches the drift region 2d.

Specifically, first, a mask film (not shown) made, for example, of a plasma oxide film and having, on the source region 4, an open pattern for forming the trench is formed by lithography and etching. Reactive ion etching (RIE) is performed using this mask film. As a result, a trench 5 with a depth of 1.5 μm and a width of 1 μm, for example, is formed in the SiC layer 2. The trench 5 is formed to intersect with the off-direction of the substrate 1 perpendicularly, for example. Thus, a plane close to the {11-20} plane is formed on the sidewall of the trench 5.

In FIG. 2(b), the sidewall of the trench 5 is in a forward tapered shape whose opening width is increased upward with respect to the principal surface of the substrate 1. However, the sidewall of the trench 5 may be perpendicular to the principal surface of the substrate 1, or may be in a reverse tapered shape whose opening width is increased downward. Further, as shown in FIG. 10(b), if the off-direction of the substrate is the <1-100> direction, the trench 5 may be formed such hat the {1-100} plane is formed on the sidewall of the trench 5.

As an example, the taper angle of the sidewall of the trench 5 shown in FIG. 2(b) relative to the principal surface of the substrate 1 is set to 85° for both of the sidewalls on the upstream side of the off-angle and the downstream side of the off-angle. In this case, if the angle formed by the trench sidewall $5L_0$ on the upstream side of the off-angle and the (0001) just plane is $\theta L_0$, and the angle formed by the trench sidewall $5R_0$ on the downstream side of the off-angle and the (0001) just plane is $\theta R_0$, the $\theta L_0$ is 89° (the taper angle+the off-angle), and the $\theta R_0$ is 81° (the taper angle–the off-angle). That is, since the {11-20} plane is perpendicular (90°) to the (0001) plane, the trench sidewall $5R_0$ on the downstream side of the off-angle is tilted from the {11-20} plane by 9°.

Next, as shown in FIG. 3(a), the plane orientations of the opposed sidewalls of the trench 5 are corrected, for example, to the {11-20} plane, which is a characteristic of the present embodiment. Specifically, an annealing process is performed on the SiC layer 2 to cause surface diffusion in part of silicon carbide (SiC) forming the sidewalls, the upper corner portion 5T, and a lower corner portion 5B of the trench 5, thereby correcting the angles of the opposed sidewalls of the trench 5 and reducing the difference in plane orientation between the sidewalls of the trench 5.

Specifically, for example, the substrate 1 on which the SiC layer 2 including the source region 4, the body region 3, and the drift region 2d are formed is subjected to an annealing process in an argon (Ar) gas atmosphere under a condition of a temperature of 1550° C. and a pressure of 200 hPa. The annealing time is 16 minutes, for example.

The annealing process causes the surface diffusion in part of SiC forming the sidewalls, the upper corner portion, and the bottom corner portion of the trench 5. Due to the surface diffusion phenomenon, a just plane, which is a stable plane, easily emerges in the sidewalls of the trench 5. As a result, each of an angle θL formed by the trench sidewall 5L on the upstream side of the off-angle and the (0001) just plane, and an angle θR formed by the trench sidewall 5R on the downstream side of the off-angle and the (0001) just plane can be 86° or more and 94° or less (within ±4° from the just plane). It is thus possible to form the {11-20} plane of which a tilt of the plane orientation from the just plane is small. Each of the angles θL, θR can be 88° or more and 92° or less (within ±2° from the just plane) in the optimal annealing process condition, and can be 89° or more and 91° or less (within ±1° from the just plane) in the more optimal annealing process condition.

Further, as shown in FIG. 3(a), the annealing process for correcting the plane orientations of the opposed sidewalls of the trench 5 makes both of the upper corner portion 5T and the lower corner portion 5B of the trench 5 have a round shape. However, if the temperature of the annealing process is too high, or a period of time of the annealing process is too long, the radius of curvature of each of the upper corner portion 5T and the lower corner portion 5B of the trench 5 is increased. Thus, it is preferable that the round portion of the upper corner portion 5T does not reach the body region 3 forming the sidewall of the trench 5. If the round portion reaches the body region 3 forming the sidewall of the trench 5, tilting of the plane orientation of the body region 3 partially occurs, and the carrier channel mobility is reduced.

The conditions of the annealing process are not limited to those described above. For example, the gas atmosphere may be an inert gas atmosphere using argon gas, etc., a hydrogen atmosphere, or chlorine gas atmosphere, or an atmosphere of a mixture of these gases. However, the argon gas atmosphere is preferable, since not having an etching effect and being superior in terms of cost.

The temperature of the annealing process is not specifically limited, but it is preferable to set the temperature to 1500° C. or more and 1600° C. or less, for example. If the temperature is 1500° C. or more, the surface diffusion of the SiC layer can be sufficiently performed in a short period of time, i.e., less than one hour, thereby making it possible to form the sidewall of the trench 5 with a small tilt of the plane orientation.

It is preferable to appropriately adjust the specific conditions of the annealing process so that the depth and the width of the trench 5 is maintained in an allowable range in terms of device design.

The annealing temperature may be changed according to types of the substrate 1 to be used. For example, in the case of using a gallium nitride (GaN) substrate, the temperature of the annealing process may be set to be lower than in the case in which an SiC substrate is used.

The step of correcting the plane orientations of the sidewalls of the trench 5 to a predetermined plane orientation, e.g., a {11-20} plane, is not limited to the above annealing process. That is, the method is not limited to a surface diffusion phenomenon by annealing, and etching may also be used.

Next, as shown in FIG. 3(b), the gate insulating film 8 is formed to cover at least the sidewall of the trench 5. Specifically, first, the substrate 1 having the trench 5 with the corrected angle of the sidewall is cleaned. After that, for example, the substrate 1 is placed in a thermal oxidation furnace, and a thermal oxidation process is performed at a temperature of 1200° C. for 0.5 hour under a dry oxidation atmosphere. As a result, as the gate insulating film 8, a silicon oxide film, which is a thermal oxidation film, is formed on an upper surface of the body region 3 and an upper surface of the source region 4, and on the sidewall and the bottom surface of the trench 5. The gate insulating film 8 may also be an insulating film deposited by a chemical vapor deposition (CVD) method or a sputtering method.

Next, as shown in FIG. 4(a), the gate electrode 9 is formed to fill in the trench 5, with the gate insulating film 8 interposed between the gate electrode 9 and the trench 5.

Specifically, first, a polysilicon film doped with phosphorus (P) is deposited on the entire surface of a wafer on which the gate insulating film 8 is formed, by a low pressure CVD (LP-CVD) method in a thickness of 1000 nm, for example. Subsequently, the doped phosphorus is activated by a rapid thermal annealing (RTA) process at a temperature of 1000° C. for 60 seconds in an inert gas atmosphere, for example. After that, for example, a resist film (not shown) for masking a gate electrode formation region is formed on the polysilicon film by lithography and etching. Then, by an RIE method, the polysilicon film is etched using the resist film as a mask, thereby forming the gate electrode 9. It is sufficient if the gate electrode 9 is formed in a region that faces at least the body region 3 in the trench 5, and is not limited to the shape shown in FIG. 3(b). For example, the gate electrode 9 may be in a shape that does not fill the entire trench 5.

Next, as shown in FIG. 4(b), the source electrode 10 is formed so as to be spaced from the gate electrode 9 and in contact with the body region 3 and the source region 4. That is, the source electrode 10 is placed on the SiC layer 2 over the body region 3 and the source region 4.

Specifically, first, an interlayer insulating film (not shown) is formed so as to cover the SiC layer 2 and the gate electrode 9 by a CVD method, etc. Subsequently, an opening is formed in the interlayer insulating film to expose a boundary portion between the source region 4 and the body region 3 by lithography and etching. After that, a conductive film made, for example, of Ti is formed by sputtering, etc., in the opening formed in the interlayer insulating film, and an annealing process is performed if necessary. As a result, the source electrode 10 in an ohmic contact with the source region 4 and the body region 3 can be obtained.

Next, a conductive film made, for example, of Ti is formed on the back surface of the substrate 1 which is opposite to the principal surface of the substrate 1, and an annealing process is performed if necessary, thereby forming the drain electrode 11. The order of formation of the source electrode 10 and the drain electrode 11 is not specifically decided.

The semiconductor device 100 which is a trench type MISFET can be obtained by the above method.

According to the manufacturing method of the present embodiment, it is possible to form a plane close to a just plane on each of the trench sidewall 5L on the upstream side of the off-angle and the trench sidewall 5R on the downstream side of the off-angle, even in the case where a trench 5 is formed in the substrate 1 with an off-angle. Thus, it is possible to ensure high carrier channel mobility at the MIS interfaces of both of the sidewalk of the trench 5. As a result, it is possible to provide a trench type MISFET with less on resistance and capable of allowing a large current to flow.

Further, according to the manufacturing method of the present embodiment, the plane orientations of the opposed sidewalls of the trench 5 are corrected by an annealing process. Thus, for example, a substrate 1 with a desired off-angle can be used for the purpose of stable epitaxial growth. For example, even in the case where a substrate 1 with a relatively large off-angle is used to reduce crystal defects such as a triangular defect formed in an epitaxial film, the carrier mobility at the MIS interfaces of both of the sidewalls of the trench 5 can be improved by the succeeding annealing process. In other words, both the stable epitaxial growth and the improvement in carrier mobility can be achieved.

Variation of Manufacturing Method

A variation of the method for manufacturing the semiconductor device according to the present embodiment will be described below, with reference to FIG. 5(a) and FIG. 5(b).

In the step of forming the trench 5 in the SiC layer 2, a sample 100A is held in a tilted position on a flat electrode 64 in a dry etching apparatus, thereby making it possible to form the trench 5 that is tilted with respect to the principal surface of the sample 100A. That is, the trench 5 can be formed in a direction along the c-axis by setting an angle formed by the voltage application direction in dry etching and the c-axis direction of the substrate 1 small.

FIG. 5(a) illustrates the state in which the sample 100A, which is a substrate provided with a mask layer 61, such as a plasma oxide film, on part of the source region 4, is held in a tilted position in a dry etching apparatus. As shown in FIG. 5(a), an RIE apparatus having parallel flat plates composed of a counter electrode (anode) 63 and a flat electrode (cathode) 64 which are provided in a chamber, and an RF oscillator provided outside the chamber is used as the dry etching apparatus.

The sample 100A is held on the flat electrode 64, with a base 62 tilted by the angle $\theta_0$ interposed therebetween. The sample 100A may be placed on the base 62 such that a (0001) just plane of the sample 100A is in parallel with the surfaces of the parallel flat plates, that is, such that the angle $\theta_0$ and the off-angle $\theta$ of the substrate 1 of the sample 100A coincide with each other. In dry etching, positive ions, i.e., an active gas in plasma, are injected perpendicularly into the flat electrode 64, and anisotropic etching is performed. At this moment, since the sample 100A is held in the position tilted by the angle $\theta_0$, the trench 5 is etched obliquely at the angle $\theta_0$, not in a direction perpendicular to a normal line to the substrate 100A.

FIG. 5(b) illustrates a cross-sectional configuration of the sample 100A after dry etching. As shown in FIG. 5(b), the trench 5 of the present variation is formed such that the center axis of the trench 5 is tilted obliquely with respect to the principal surface 52 of the SiC layer 2. Tilts of the plane orientations of the opposed sidewalls of the trench 5 can be approximately equalized by forming the trench 5 such that its central axis is tilted at approximately the same angle as the off-angle $\theta$ of the substrate 1.

Specifically, if the angle formed by the trench sidewall $5L_0$ on the upstream side of the off-angle and the (0001) just plane is $\theta L_0$, and the angle formed by the trench sidewall $5R_0$ on the downstream side of the off-angle and the (0001) just plane is $\theta R_0$, amounts of tilts of the plane orientations of the angle $\theta L_0$ and the angle $\theta R_0$ can be approximately equalized.

As a result, it is possible to reduce the time for the annealing process for correcting the opposed sidewalls of the trench 5.

EXAMPLES

Examples will be described below with reference to FIG. 6(a) to FIG. 6(c). In the following description, a step of correcting the plane orientations of the sidewalls of the trench, which is a characteristic of the present disclosure, will be described.

The inventors of the present application conducted intensive studies and found out that performing an annealing process on a trench having sidewalls of different plane orientations had made it possible to form, if the off-angle direction is a <11-20> direction, {11-20} just planes on both of the opposed sidewalls of the trench extending in a <1-100> direction.

FIG. 6(a) is a SEM image of a cross section of the trench 5 before the annealing process. As shown in FIG. 6(a), the left (upstream side of the off-angle) sidewall of the trench has a plane almost close to the {11-20} plane by optimizing the etching conditions and coinciding the taper angles. In contrast, the right (downstream side of the off-angle) sidewall of the trench is tilted by about 8° from the {11-20} plane. The broken line in the drawing indicates the {11-20} plane.

FIG. 6(b) is a SEM image of a cross section of the trench shown in FIG. 6(a) after an annealing process is performed in an argon (Ar) atmosphere at a temperature of 1550° C. and a pressure of 200 hPa for two minutes. It is acknowledged from FIG. 6(b) that the tilt of the plane orientation of the right (downstream side of the off-angle) sidewall of the trench begins to be reduced.

FIG. 6(c) is a SEM image of a cross section of the trench shown in FIG. 6(a) after an annealing process is performed in an argon (Ar) atmosphere at a temperature of 1550° C. and a pressure of 200 hPa for sixteen minutes. It is acknowledged from FIG. 6(c) that the tilt of the plane orientation of the right (downstream side of the off-angle) sidewall of the trench is significantly reduced, and that the right sidewall of the trench has a plane almost close to the {11-20} plane.

The mechanism of such an improvement of the plane orientation is estimated to be a surface diffusion phenomenon of SiC due to the high-temperature annealing process, and it is assumed that due to the surface diffusion phenomenon of SiC, the {11-20} plane, which is a stable plane, emerges on the sidewalls of the trench.

As shown in images of FIG. 6(b) and FIG. 6(c), the upper corner portion and the bottom corner portion of the trench have a round shape, and this is also one of surface diffusion phenomenon. There is not an etching effect because Ar, which is an inert gas, is used in the annealing atmosphere. Argon (Ar) may be replaced with helium (He) or neon (Ne), etc., in the annealing atmosphere. Nitrogen (N) may also be used as the inert gas, but if the substrate is made of SiC, nitrogen may be taken into the SiC substrate, depending on the annealing conditions, since nitrogen serves as a dopant.

First Variation of Embodiment

A semiconductor device of the first variation of the present embodiment will be described below with reference to FIG. 7(a) and FIG. 7(b).

In a semiconductor device 200 of the first variation shown in FIG. 7(a) and FIG. 7(b), like reference characters have been used to designate elements identical to those of the semiconductor device 100 of the embodiment, and differences will be described.

As shown in FIG. 7(a), the semiconductor device 200 of the present variation is characterized by having a channel layer 12 made of SiC of a first conductivity type (n type) at least between the sidewall of the trench 5 and the gate insulating film 8. Further, if the angle formed by the trench sidewall 5L on the upstream side of the off-angle and the (0001) just plane is $\theta L$, if the angle formed by the interface (MIS interface) between the gate insulating film 8 and the channel layer 12 on the upstream side of the off-angle and the (0001) just plane is $\theta Lce$, if the angle formed by the trench sidewall 5R on the downstream side of the off-angle and the (0001) just plane is $\theta R$, and if the angle formed by the interface (MIS interface) between the gate insulating film 8 and the channel layer 12 on the downstream side of the off-angle and the (0001) just plane is θRce, each of the angles θL, θLce, θR and θRce is set to 86° or more and 94° or less. These angles θL, θLce, θR and θRce may be set to 88° or more and 92° or less, and may be set to 89° or more and 91° or less. That is, the tilt of each of the angles θL, θLce, θR and θRce from the {11-20} just plane may be 4° or less, 2° or less, or 1° or less.

For example, the channel layer 12 has a carrier density of $1 \times 10^{18}$ cm$^{-3}$, and a thickness of 20 nm. The channel layer 12 may be an epitaxial film formed by chemical vapor deposition. If the channel layer 12 is an epitaxial film, an improvement in carrier channel mobility is expected since the channel layer 12 has higher crystallinity than the crystallinity of the surface of the trench 5 after formation of the trench 5. As a specific method for forming the epitaxial film by chemical vapor deposition, a CVD device is used, and a silane ($SiH_4$) gas, for example, as a silicon-based gas, a propane ($C_3H_8$) gas, for example, as a carbon-based gas, and a nitrogen ($N_2$) gas, for example, as a dopant gas in the case of an n type gas, is supplied and is heated to a temperature of 1500° C. or more and 1600° C. or less. However, the method is not limited to those materials and conditions. For example, the channel layer 12 can be epitaxially grown even under a wider temperature range, 1450° C. or more and 1650° C. or less.

Further, in the case of fabricating a normally-off type MISFET, the carrier density and the thickness of the channel layer 12 need to be decided such that the entire channel layer 12 is completely depleted due to a pn junction with the body region 3. For example, if the carrier density of the body region 3 is $1 \times 10^{18}$ cm$^{-3}$, the carrier density of the channel layer 12 is $2 \times 10^{18}$ cm$^{-3}$ and the thickness thereof may be about 20 nm. If the carrier density of the body region 3 is $1 \times 10^{19}$ cm$^{-3}$, the carrier density of the channel layer is $2 \times 10^{18}$ cm$^{-3}$ and the thickness thereof may be about 35 nm. The channel layer 12 may have a single layer structure or a multilayer structure. The thickness of the channel layer 12 may be appropriately adjusted according to a design value of a gate threshold voltage.

The MISFET including the first conductivity type (n type) channel layer 12 described above is called an accumulation type MISFET, of which the operation is partially different from a MISFET (see FIG. 1(a) and FIG. 1(b)) of the embodiment not including the channel layer 12. For example, in the OFF state in which a bias voltage lower than a threshold voltage is applied to the gate electrode 9, the channel layer 2 is depleted due to the pn junction between the channel layer 12 and the body region 3, and therefore, a current does not flow (i.e., an OFF state). In the ON state in which a bias voltage equal to or higher than the threshold voltage is applied to the gate electrode 9, electrons are accumulated in high density in the channel layer 12 of the first conductivity type, and therefore a current flows (i.e., an ON state).

The semiconductor device 200 which is a trench type MISFET including the channel layer 12 can be obtained by the method above.

According to the first variation, both of the sidewall of the trench on the upstream side of the off-angle and the sidewall of the trench on the downstream side of the off-angle have a plane close to the {11-20} just plane, even in the case where the trench is formed in the substrate with an off-angle, and the channel layer formed on the MIS interface of the sidewall of the trench has higher crystallinity. It is thus possible to ensure high carrier channel mobility at the both sidewalls of the trench. As a result, it is possible to provide a trench type MISFET with less on resistance and capable of allowing a large current to flow.

Second Variation of Embodiment

A semiconductor device of the second variation of the embodiment will be described below with reference to FIG. 8(a) and FIG. 8(b).

In a semiconductor device 300 of the second variation shown in FIG. 8(a) and FIG. 8(b), like reference characters have been used to designate elements identical to those of the semiconductor device 200 of the first variation, and differences will be described.

As shown in FIG. 8(a), similarly to the first variation, a channel layer 12 made of SiC of a first conductivity type (n type) is formed at least between the sidewall of the trench 5 and the gate insulating film 8 in the second variation, as well.

Further, in the present variation, as well, if the angle formed by the interface (MIS interface) between the gate insulating film 8 and the channel layer 12 on the upstream side of the off-angle and the (0001) just plane is θLce, and the angle formed by the interface (MIS interface) between the gate insulating film 8 and the channel layer 12 on the downstream side of the off-angle and the (0001) just plane is θRce, each of the angles θLce, θRce is set to 86° or more and 94° or less. These angles θLce, θRce may be set to 88° or more and 92° or less, or may be set to 89° or more and 91° or less.

The second variation is characterized in that, in the trench 5 formed in the semiconductor device 300, at least one of the angle θL formed by the trench sidewall 5L on the upstream side of the off-angle and the (0001) just plane, and the angle θR formed by the trench sidewall 5R on the downstream side of the off-angle and the (0001) just plane is not an angle of 86° or more and 94° or less.

In the present variation, as well, similarly to the manufacturing method of the embodiment, the angles θL, θR of the trench sidewalls 5L, 5R are corrected and the tilts of the plane orientations are reduced, by performing an annealing process and causing surface diffusion in part of the SiC layer 2 forming the sidewalls, the upper corner portion, and the bottom corner portion of the trench 5.

However, there are some cases in which the annealing process cannot be sufficiently performed due to a structure of the semiconductor device. That is, there are some cases like the present variation in which the amount of reduction (the amount of correction) of tilts of the plane orientations is insufficient.

Thus, in the present variation, the thickness of the channel layer 12 on the sidewall portion of the trench 5 on the upstream side of the off-angle and the thickness of the channel layer 12 on the sidewall portion of the trench 5 on the downstream side of the off-angle are different from each other. Also, the channel layer 12 has greater thickness distribution in the direction of thickness of the trench 5. By doing so, the angle θLce formed by the MIS interface between the gate insulating film 8 and the channel layer 12 on the upstream side of the off-angle and the (0001) just plane, and the angle θRce formed by the MIS interface between the gate insulating film 8 and the channel layer 12 on the downstream side of the off-angle and the (0001) just plane, are corrected to 86° or more and 94° or less. Since a region in the channel layer 12 near the MIS interface is a region where electrons as carriers travel at the highest rate, the carrier channel mobility can be improved even in the structure of the present variation.

The channel layer 12 can be formed, similarly to the first variation, by using a CVD device and supplying a silane gas, for example, as a silicon-based gas, a propane gas, for example, as a carbon-based gas, and nitrogen gas, for example, as a dopant gas in the case of an n type gas, and heating to a temperature of 1500° C. or more and 1600° C. or less. The thickness of the channel layer 12 can be changed by increasing the pressure during growth or increasing the supply amount of the material. For example, the pressure may be set to 300 hPa, and the supply amount of silane gas may be set to 30 ml/min (0° C., 1 atm).

The semiconductor device 300 which is a trench type MISFET including the channel layer 12 can be obtained by the method above.

According to the second variation, both of the MIS interface at a trench sidewall portion on the upstream side of the off-angle, and the MIS interface at a trench sidewall portion on the downstream side of the off-angle have a plane close to the {11-20} just plane, even in the case where the trench is formed in the substrate with an off-angle, and the channel layer formed on the MIS interface of the sidewall of the trench has higher crystallinity. It is thus possible to ensure high carrier channel mobility at the both sidewalls of the trench. As a result, it is possible to provide a trench type MISFET with less on resistance and capable of allowing a large current to flow.

Each of the semiconductor devices in the present embodiment and its variations has been described as an n type MISFET of which the conductivity type is n type, that is, the carriers are electrons. However, the conductivity type is not limited to n type, and the semiconductor devices may be p type MISFETs of which the carriers are holes. In this case, the first conductivity type in the present specification is p type, and the second conductivity type is n type.

The semiconductor devices in the present embodiment and its variations have a MISFET structure in which a gate insulating film is formed between the SiC layer and the gate electrode, but may have a MESFET structure without the gate insulating film.

Figure 10:
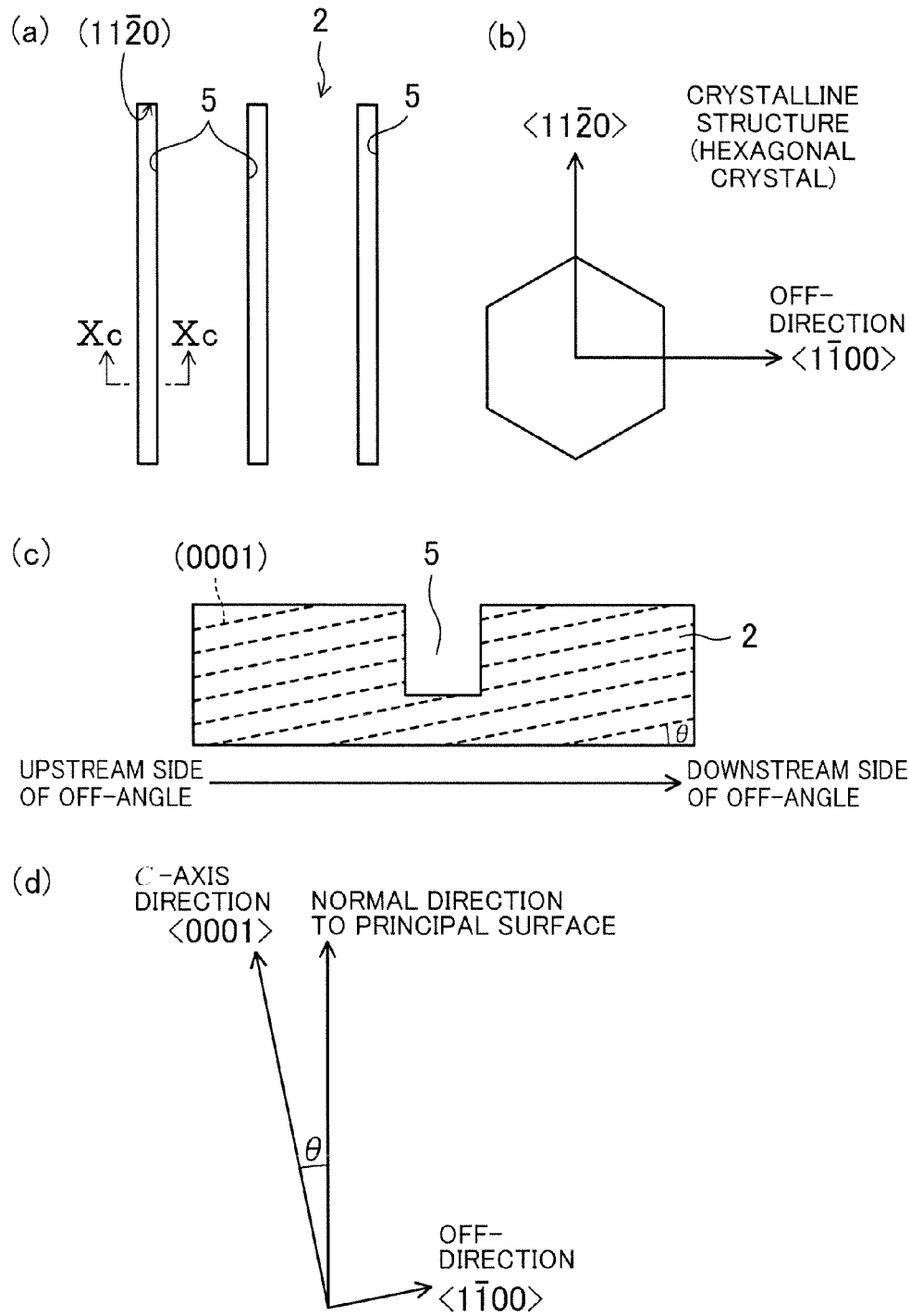
FIG. 10(a) through FIG. 10(c) schematically illustrate another example relationship between the off-direction of the off-angle set in the substrate forming the semiconductor device, and the plane orientation of the channel surface of the trench.
FIG. 10(d) shows a direction of a normal line to the principal surface of the semiconductor layer (the SiC layer), the c-axis direction, and the off-direction.

As shown in FIG. 9 and FIG. 10, in the semiconductor devices in the present embodiment and its variations, the trench extends in a direction intersecting the off-direction of the substrate with an off-angle, but the extension direction is not limited to this direction, and the trench may extend in a direction parallel to the off-direction or in a direction substantially parallel to the off-direction.

In each of the present embodiment and its variations, it is possible to form an insulated gate bipolar transistor (IGBT) by making the substrate and the semiconductor layer (the drift region) on the substrate have different conductivity types. In the case of an IGBT, the source electrode 10, the drain electrode 11, and the source region 4 of the above-mentioned trench type MISFET are called an emitter electrode, a collector electrode, and a emitter region, respectively.

Thus, in the semiconductor device of the present embodiment, an n type IGBT can be obtained by making the drift region and the emitter region have n type conductivity, and the substrate and the body region have p type conductivity. An n type buffer layer may be provided between the p type substrate and the n type drift region. Further, a p type IGBT can be obtained by making the drift region and the emitter region have p type conductivity, and the substrate and the body region have n type conductivity. A p type buffer layer may be provided between the n type substrate and the p type drift region.

In the present embodiment and its variations, an example in which a plurality of unit cells are arranged in parallel to each other has been described, but the unit cells may be provided in any arrangement.

In the present embodiment and its variations, the planar shape of each trench is in a rectangular shape, and the unit cells are arranged such that the long sides of the plurality of trenches are parallel to one another. However, the planar shape of each trench is not limited to the rectangular shape. For example, the trench may be in a square shape in plan view. In this case, the trench width direction is along any one of sides.

In the present embodiment and its variations, an example in which the substrate is made of 4H—SiC; the (0001) Si surface is the principal surface; and an SiC layer is formed on the principal surface, has been described. However, the SiC layer may be formed on a (000-1) C plane, and the drain electrode may be formed on the (0001) Si plane. Further, the plane orientation of the principal surface of the substrate may be a different crystal plane, and the principal surface of the substrate may be any off-cut plane of the Si plane or the C plane. Further, another polytype SiC substrate may also be used.

The drawings attached to the present specification illustrate that the tilt of the plane orientation is reduced at the entire body region as part of the sidewall of the trench. However, it is possible to improve the carrier channel mobility even if the tilt of the plane orientation is reduced at only part of the body region of the sidewall of the trench. In this case, as well, it is preferable that the tilt of the plane orientation is reduced at least one-half of the body region of the sidewall of the trench.

Further, the present invention is applicable to a semiconductor device in which different semiconductor with a wide band gap, such as gallium nitride (GaN) or diamond (C), is used in place of the SiC substrate. It is also applicable to a semiconductor device using silicon (Si).

Various elements of the present embodiment and its variations, such as the shape and size of element members, and impurity concentrations and element materials, can be appropriately modified without departing from the scope of the present disclosure.

INDUSTRIAL APPLICABILITY

The semiconductor device and the method for manufacturing the semiconductor device according to the present disclosure are useful, for example, for a semiconductor device having a trench gate type structure, and more specifically useful for use in vehicles, such as electric vehicles (EVs) or hybrid electric vehicles (HEVs), or useful as power semiconductor devices for use in inverters for industrial equipment.

DESCRIPTION OF REFERENCE CHARACTERS 1 substrate
2 SiC layer
2d drift region
3 body region
4 source region
5 trench
5B lower corner portion
5L, $5L_0$ trench sidewall (second sidewall) on upstream side of off-angle
5R, $5R_0$ trench sidewall (first sidewall) on downstream side of off-angle
5T upper corner portion
8 gate insulating film
9 gate electrode
10 source electrode
11 drain electrode
12 channel layer
52 principal surface
61 mask layer
62 base
63 counter electrode (anode)

64 flat electrode (cathode)
100, 200, 300 semiconductor device
100A sample

The invention claimed is:

1. A semiconductor device, comprising:
a substrate with an off-angle;
a semiconductor layer provided on a principal surface of the substrate, including a first semiconductor region of a first conductivity type, and having a trench whose bottom is located in the first semiconductor region; and
a gate electrode provided in the trench in the semiconductor layer,
wherein in the trench in the semiconductor layer, a first angle formed by at least part of a first sidewall on an off-direction side and the principal surface of the substrate is an obtuse angle, and a second angle formed by at least part of a second sidewall opposite to the first sidewall and the principal surface of the substrate is an acute angle, in a cross section parallel to a direction of a normal line to the principal surface of the substrate and a direction of a c-axis of the substrate,
the semiconductor device further includes a gate insulating film provided between the sidewalls of the trench in the semiconductor layer and the gate electrode,
the semiconductor layer further includes a drift region which is the first semiconductor region, a body region of a second conductivity type provided on the drift region, and a second semiconductor region of the first conductivity type provided in an upper portion of the body region,
the trench passes through the second semiconductor region and the body region and reaches the drift region,
the at least part of the first sidewall is a portion of the first sidewall located at the body region, and
the at least part of the second sidewall is a portion of the second sidewall located at the body region.

2. The semiconductor device of claim 1, wherein
a tilt of an orientation of each of the at least part of the first sidewall and the at least part of the second sidewall relative to a {11-20} plane or a {1-100} plane is smaller than the off-angle.

3. The semiconductor device of claim 1, wherein
an upper surface of an upper corner portion of the trench in the semiconductor layer is tilted downward to an inner side of the trench.

4. The semiconductor device of claim 1, further comprising:
a drain electrode provided on a surface of the substrate opposite to the surface where the semiconductor layer is provided; and
a source electrode provided on the second semiconductor region and the body region, wherein
the second semiconductor region is a source region, and
the substrate has the first conductivity type.

5. The semiconductor device of claim 1, wherein
in the trench in the semiconductor layer, a tilt of an orientation of each of the at least part of the first sidewall and the at least part of the second sidewall relative to a {11-20} plane or a {1-100} plane is less than or equal to 4°.

6. The semiconductor device of claim 1, wherein
the semiconductor layer includes a channel layer provided at at least a region between the body region and the gate insulating film and made of semiconductor of the first conductivity type.

7. The semiconductor device of claim 6, wherein
the thickness of the channel layer on the first sidewall and the thickness of the channel layer on the second sidewall differ from each other.

8. A method for manufacturing a semiconductor device, the method comprising the steps of:
forming a semiconductor layer including a first semiconductor region of a first conductivity type, on a principal surface of a substrate with an off-angle;
forming, in the semiconductor layer, a trench whose bottom reaches the first semiconductor region; and
after forming the trench, performing an annealing process on the semiconductor layer, wherein
in the step of performing the annealing process,
an upper surface of an upper corner portion of the trench in the semiconductor layer is tilted downward to an inner side of the trench, and
of a sidewall of the trench, a first sidewall on an off-direction side in a cross section parallel to a direction of a normal line to the principal surface of the substrate and a direction of a c-axis of the substrate is corrected to be close to a predetermined plane orientation, thereby making a first angle formed by at least part of the first sidewall and the principal surface of the substrate an obtuse angle, and a second angle formed by at least part of a second sidewall opposite to the first sidewall and the principal surface of the substrate an acute angle, in the cross section.

9. The method of claim 8, further comprising the steps of:
after the step of performing the annealing process,
forming a gate insulating film to cover the sidewalls of the trench; and
forming a gate electrode on the gate insulating film inside the trench,
wherein the semiconductor layer includes a drift region which is the first semiconductor region, a body region of a second conductivity type formed on the drift region, and a second semiconductor region of the first conductivity type formed in an upper portion of the body region,
the trench passes through the second semiconductor region and the body region and reaches the drift region, and
the body region is formed at the at least part of the first sidewall and the at least part of the second sidewall.

10. The method of claim 9, further comprising the steps of:
forming a drain electrode on a surface of the substrate opposite to the surface where the semiconductor layer is formed; and
forming a source electrode on the second semiconductor region and the body region, wherein
the second semiconductor region is a source region, and
the substrate has the first conductivity type.

11. The method of claim 8, wherein
in the step of forming the trench,
the trench is formed by dry etching, and an angle formed by a voltage application direction in the dry etching and the direction of the c-axis of the substrate is set to be smaller than the off-angle.

12. The method of claim 8, wherein
the annealing process is performed in an inert gas atmosphere.

13. The method of claim 8, wherein
the annealing process is performed at 1500° C. or more and 1600° C. or less.

14. The method of claim 9, further comprising the step of:
before the step of forming the gate insulating film and after the step of performing the annealing process, forming a channel layer made of semiconductor of the first conductivity type on the sidewalls of the trench.

15. The method of claim 14, wherein
in the step of forming the channel layer,
the channel layer is formed such that a tilt of an orientation of an interface between the gate insulating film and the channel layer at a sidewall portion of the trench on the off-direction side, relative to a {11-20} plane or a {1-100} plane, is less than or equal to 4°.

16. The method of claim 8, wherein
the direction of the c-axis is a <0001> direction, and
the off-direction is a <11-20> direction or a <1-100> direction.

17. The method of claim 8, wherein
the substrate and the semiconductor layer are made of silicon carbide.

* * * * *